US011566555B2

United States Patent
Depcik et al.

(10) Patent No.: US 11,566,555 B2
(45) Date of Patent: Jan. 31, 2023

(54) ADVANCED PREDICTION MODEL FOR SOOT OXIDATION

(71) Applicant: University of Kansas, Lawrence, KS (US)

(72) Inventors: Christopher Depcik, Lawrence, KS (US); Matthew Cole, Portland, OR (US)

(73) Assignee: University of Kansas, Lawrence, KS (US)

( * ) Notice: Subject to any disclaimer, the term of this patent is extended or adjusted under 35 U.S.C. 154(b) by 0 days.

(21) Appl. No.: 17/260,102

(22) PCT Filed: Aug. 30, 2019

(86) PCT No.: PCT/IB2019/057361
§ 371 (c)(1),
(2) Date: Jan. 13, 2021

(87) PCT Pub. No.: WO2020/044315
PCT Pub. Date: Mar. 5, 2020

(65) Prior Publication Data
US 2021/0277817 A1  Sep. 9, 2021

Related U.S. Application Data

(60) Provisional application No. 62/725,242, filed on Aug. 30, 2018.

(51) Int. Cl.
*F01N 9/00* (2006.01)

(52) U.S. Cl.
CPC ...... *F01N 9/005* (2013.01); *F01N 2900/0601* (2013.01)

(58) Field of Classification Search
CPC combination set(s) only.
See application file for complete search history.

(56) References Cited

U.S. PATENT DOCUMENTS 8,332,124 B2  12/2012  George et al.
8,365,586 B2  2/2013  Ardanese et al.
(Continued)

FOREIGN PATENT DOCUMENTS

CN  101646847 B  11/2012
CN  103133105 B  5/2018
(Continued)

OTHER PUBLICATIONS

Patent Cooperation Treaty, International Search Report and Written Opinion issued for PCT Application No. PCT/IB2019/057361, dated Jan. 29, 2020, 9 pages.
(Continued)

*Primary Examiner* — Binh Q Tran
(74) *Attorney, Agent, or Firm* — Norton Rose Fulbright US LLP

(57) ABSTRACT

Systems, methods, and computer readable storage media for controlling oxidation of a particulate filter (PF) are closed. The oxidation of the PF may be controlled using a PF model. The PF model may be utilized to simulate operations of the PF based on various input data and/or derived data to determine an optimum time for initiating an oxidation event at the PF, and an oxidation event may be initiated at the PF based on the simulating.

20 Claims, 20 Drawing Sheets

(56) References Cited

U.S. PATENT DOCUMENTS

| | | |
|---|---|---|
| 2004/0031262 A1 | 2/2004 | Gui et al. |
| 2007/0056273 A1 | 3/2007 | Wills |
| 2007/0256407 A1 | 11/2007 | Reuter |
| 2009/0145111 A1* | 6/2009 | Takahashi ............ F01N 3/0231 60/277 |
| 2010/0058832 A1 | 3/2010 | Onishi et al. |
| 2010/0126144 A1* | 5/2010 | He ..................... F01N 13/0097 60/286 |
| 2011/0041476 A1 | 2/2011 | Zanetti et al. |
| 2012/0031080 A1 | 2/2012 | Barasa |
| 2012/0053814 A1* | 3/2012 | George ............... F02D 41/0235 701/102 |
| 2012/0159930 A1* | 6/2012 | Snopko ................. F01N 9/002 60/311 |
| 2012/0297751 A1* | 11/2012 | Sun ...................... F01N 9/002 60/274 |
| 2015/0088398 A1* | 3/2015 | Cui ...................... F01N 3/023 701/101 |

FOREIGN PATENT DOCUMENTS

| | | |
|---|---|---|
| DE | 102007009841 A1 | 9/2008 |
| DE | 102008028783 A1 | 2/2009 |
| DE | 102014113476 A1 | 3/2015 |
| DE | 102014203621 B4 | 2/2016 |
| EP | 1669574 A2 | 6/2006 |
| EP | 1837500 B1 | 10/2010 |
| EP | 2997242 B1 | 7/2016 |
| EP | 3056698 A1 | 8/2016 |
| EP | 2479409 B1 | 4/2017 |
| KR | 19980083741 A | 5/1998 |
| KR | 20130050999 A | 5/2013 |
| KR | 20130114174 A | 10/2013 |
| WO | WO-2008019399 A2 | 2/2008 |

OTHER PUBLICATIONS

Koltsakis, Grigorios et al. "Catalyzed diesel particulate filter modeling," Reviews in Chemical Engineering, Published in De Gruyter, Feb. 2013, [retrieved on Jan. 16, 2020]. Retrieved from <https://www.researchgate.net/publication/258933688>, 62 pages.

Mahadevan, Boopathi S. et al. "Experimental and Simulation Analysis of Temperature and Particulate Matter Distribution for a Catalyzed Diesel Particulate Filter," Emission Control Science and Technology, Published in Springer SIP, Aug. 15, 2015, [retrieved on Jan. 16, 2020], Retrieved from <https://link.springer.com/article/10.1007/s40825-015-Q022-y>, 30 pages.

* cited by examiner

ADVANCED PREDICTION MODEL FOR SOOT OXIDATION

PRIORITY

This application is a national phase application under 35 U.S.C. § 371 of International Application No. PCT/IB2019/057361 filed Aug. 30, 2019, which claims priority to U.S. Provisional Patent Application No. 62/725,242 filed Aug. 30, 2018. The entire contents of each of the above-referenced disclosures is specifically incorporated by reference herein without disclaimer.

TECHNICAL FIELD

The present disclosure generally relates to particulate filters and more particularly to improved techniques for modelling and controlling oxidation events of particular filters.

BACKGROUND

Particulate Matter (PM) is the emission that most people consider when thinking about the environmental impacts of direct injection engines. The Environment Protection Agency lists several health risks from exposure to PM including heart attack, decreased lung function, or even premature death in those who already suffer from lung or heart disease. PM is additionally a primary component in acid rain that can be destructive for the environment. In the past, PM was primarily considered a problem for compression ignition (e.g., diesel) engines. With that in mind, there is a great deal of research into particulate filters (PFs) used to reduce the emissions of PM. However, PM emissions are no longer a problem just for diesel engines. The switch from gasoline port fuel injection (PFI) to direct injection (GDI) has greatly improved engine performance; however, PM emissions have increased. For example, a GDI vehicle without a PF generates ten to thirty-one times more PM emissions than a similar PFI vehicle. Implementing a gasoline particulate filter (GPF) may reduce the PM emissions to only two to eight times more PM than the PFI vehicle.

The need for a GPF device has resulted in research relating to the ability to model these devices. GPF models may utilize different scales and types of filter walls, as well different channel geometries. Rubino et al. ran a series of experimental tests and then developed a one-dimensional and three-dimensional GPF models. They found that both models were accurate at low flow rates but that the one-dimensional model deviates at high flow rates (approximately above 225 kg/hour). Other work by Wurzenberger et al. compared several different modeling methods with a focus on real time control. Their modeling efforts found that a focus on stability and step size have the biggest impact on real time speed. They finally concluded that a real-time system may not need to be a simplified version of a complex "office" model but could be developed from the ground up for generating fast and reasonable results. With the ability to develop quick and accurate models, the merits of using these models in controls systems should be determined. In this area, Kumar et al. found the real-time benefits of a diesel particular filter (DPF) control by reducing emissions by 95%. Overall, the impacts of a GPF control system have not yet been quantified; however, due to the similar nature of GPFs and DPFs it should be somewhat analogous. Furthermore, Van Nieuwstadt et al. discussed the three components they believe were necessary for a GPF control system; temperature control, soot prediction, and a protection system to keep the GPF functioning.

After developing this understanding of what models are needed for real time control of a GPF other efforts in this field should be examined to determine what is being done. For instance, Wurzenburger et al. developed a 1D+1D model for use as a real-time simulation and compared a version run on real-time hardware to their office hardware. They found that this separate hardware was able to maintain the calculations at faster than real-time. Perchand et al. developed a one-dimensional model of a catalyzed diesel particulate filter, the developed model produced results which had less than 15% error when compared to their experimental data for pressure drop, pm mass, and temperatures. This was achieved while also making such assumptions as treating the exhaust gas as an ideal compressible gas mixture. On the other hand, Nicolin et al. developed a simplified 0-D model for use in comparison with an Axitrap model. They suggest that simplified models like their own can be used to accurately predict soot loading in a timely manner; however, their model does not reach the same peak temperatures as the experimental data.

In the past few years there have been several efforts made in that approach GPF modelling with different methods. In two follow up papers Wurzenburger et al. investigated the effects of soot variety and back diffusion in their 1D+1D model. The model is able to run 100 times faster than real time. Additionally, the model was integrated and tested on board a vehicle to validate its real-world effectiveness. Mahadevan et al. took a distinct approach to the creation of a faster than real time particulate filter model. Their efforts began with a high fidelity 10×10 model, from the resolution of the model was reduced to 5×5. To retain some of the accuracy lost by reducing the number of zones so dramatically a series of Kalman estimators were added that could improve the accuracy by predicting the states of the succeeding time steps. Other authors have approached the problem of PF modelling and control with other means. For instance, Chiang et al. created a Diesel oxidation catalyst and diesel particulate filter control system based in the fundamental equations of thermodynamics. Some models work backwards from experimental data using linear regression like Nieuwstadt et al. who took that approach along with using pressure sensors to model soot mass within their model. Watling et al. presented two papers that investigated parts of PF modeling that are commonly simplified. First the back pressure and momentum balance was examined. A 1-D model was created that included axial momentum perpendicular to the channel. They found that neglecting this axial momentum could cause the momentum convection to be too large by a factor of 2. In the subsequent research simplifications of channel geometry were investigated. It was found that the oversimplification of channel geometry could cause significant errors. Thus, simplification of DPFs filters plays an important role with respect to both the development of the model and the accuracy of the model.

SUMMARY

The present disclosure presents new techniques for improving the speed and reducing the file size of Particulate Filter (PF) modelling efforts, which enables PF modelling functionality to be integrated within a vehicle's Engine Management System (EMS). In contrast to previous efforts, the PF modelling techniques disclosed herein eliminate the use of differential equations and instead, solve the models algebraically, such as using the Euler Implicit differential methodology. Replacing the differential equations has facilitated development of software that can be run without including an Ordinary Different Equation (ODE) solver, thereby resulting in a faster modelling program that takes less space on an EMS. Exemplary equations that may be utilized to produce and complete an algebraic simulation of a Gasoline Particulate Filter (GPF) are described in more detail below. The PF modelling techniques disclosed herein enable oxidation events to be performed at PFs at an optimized time, thereby improving regeneration of the PF and increasing the longevity of the PF and increasing the fuel economy of the vehicle while more effectively reducing emission of particulate matter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the disclosed methods and apparatuses, reference should be made to the embodiments illustrated in greater detail in the accompanying drawings, wherein.

It should be understood that the drawings are not necessarily to scale and that the disclosed embodiments are sometimes illustrated diagrammatically and in partial views. In certain instances, details which are not necessary for an understanding of the disclosed methods and apparatuses or which render other details difficult to perceive may have been omitted. It should be understood, of course, that this disclosure is not limited to the particular embodiments illustrated herein.

DETAILED DESCRIPTION

Figure 11:
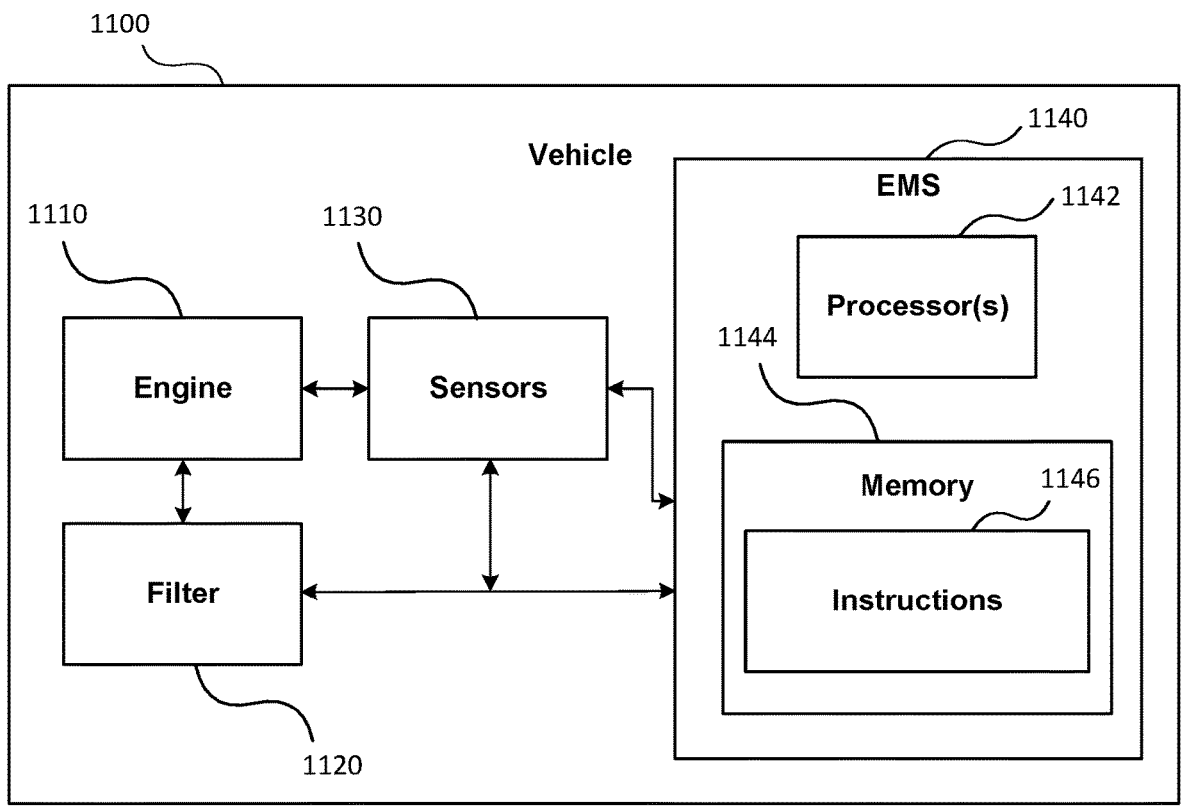
FIG. 11 is a block diagram illustrating a system including PF modelling capabilities in accordance with aspects of the present disclosure.

Referring to FIG. 11, a block diagram of a system including PF modelling capabilities in accordance with aspects of the present disclosure is shown as a system 1100. As shown in FIG. 11, the system 1100 may be embodied as a vehicle and the vehicle may include an engine 1110, a particular filter 1120, one or more sensors 1130, an engine management system (EMS) 1140. The PF may be integrated with an exhaust system of the vehicle and be configured to process at least a portion of exhaust generated by the engine 1110, such as to remove particulate matter present in the exhaust via an oxidation event, during which the PF 1120 may be regenerated by burning off soot or other particulate matter present in the PF 1120 or the exhaust gas entering the PF 1120. The one or more sensors 1130 may include one or more temperature sensors, one or more lambda sensors, or other types of sensors providing information that may be used by the PF modelling techniques disclose herein. Information (e.g., sensor data) provided by the one or more sensors 1130 may include information associated with oxygen and nitrogen level within exhaust gas generated by the engine 1110, which may provide important information for proper operation of after-treatment devices, such as particulate filters.

The EMS 1140 may include one or more processors 1142 and a memory 1144. The memory 1144 may store instructions 1146 that, when executed by the one or more processors 1142, cause the one or more processors 1142 to perform operations for controlling portions of the operations of the vehicle, such as initiating oxidation events at the PF 1120. The one or more processors 1142 and the memory 1144 may be part of the EMS 1140, as shown in FIG. 11, or may be a separate control unit. The operations associated with execution of the instructions 1146 may include receiving sensor data from the one or more sensors 1130, information associated with operation of the engine 1110, and other information. As described in more detail below, such operations may be used to more efficiently control and initiate oxidation events at the PF 1120 as compared to previous solutions.

Previously, oxidation events were controlled based on differential equation based techniques. Such solutions were too complex to be executed in real-time with an on-board computer of a vehicle, which resulted in the models being used offline (e.g., not onboard a vehicle) to construct maps of 1 dimensional temperature measurements that could be used as a lookup table by a vehicle's EMS (e.g., the EMS 1140) to determine when to initiate oxidation events at the PF 1120. In contrast, the present disclosure provides a new approach that utilizes algebraic techniques to facilitate creation of a model or modelling program that is small enough to be utilized in real-time by one or more processors of the vehicle, such as the one or more processors 1142 illustrated in FIG. 11. Additionally, the modelling techniques disclosed herein facilitate 3 dimensional (3D) temperatures of a PF to be determined, resulting in enhanced modelling accuracy, facilitating initiation oxidation events at an optimum time, and may increase the fuel economy of the vehicle. For example, the modelling techniques disclosed herein are fast enough to facilitate execution of multiple simulations (e.g., simulations may be run 100-300 times faster than combustion occurs) in order to predict an optimum time for initiating an oxidation event.

Figure 12:
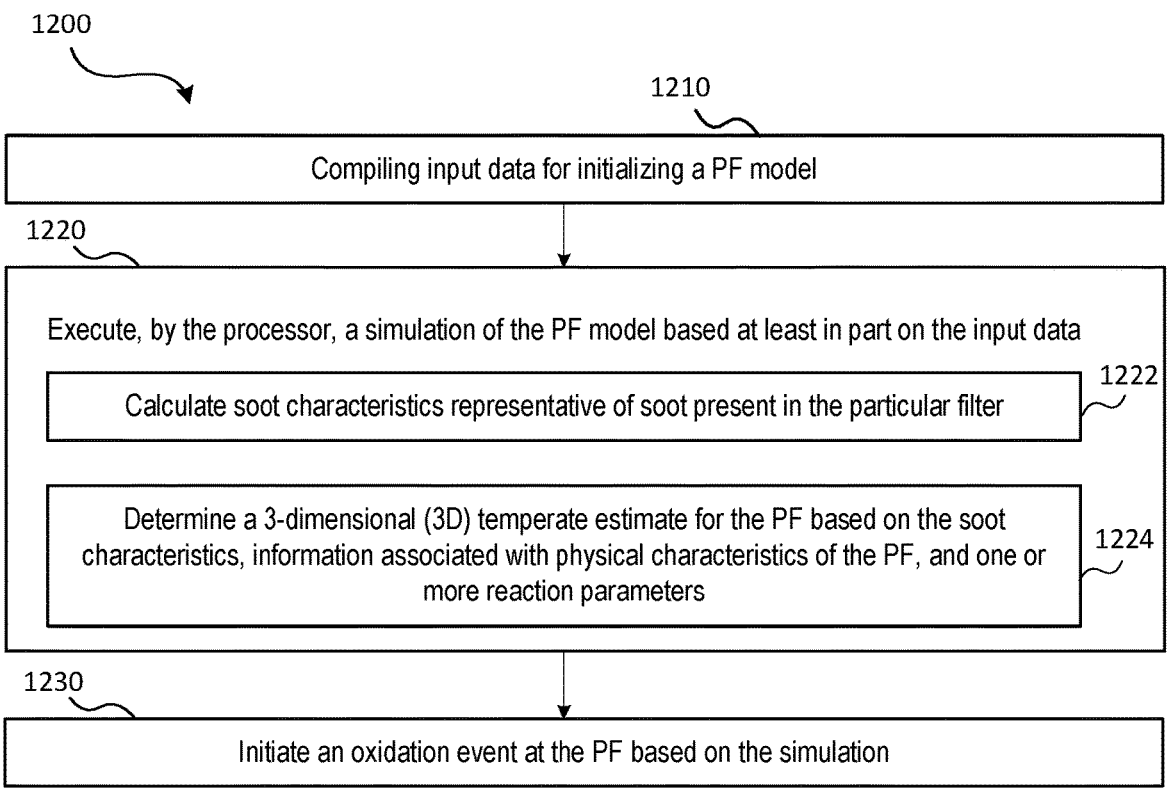
FIG. 12 is a flow diagram of an exemplary method for controlling oxidation of a particulate filter in accordance with aspects of the present disclosure.

Referring to FIG. 12, a flow diagram of an exemplary method for controlling oxidation of a particulate filter (PF) in accordance with embodiments of the present disclosure is shown as a method 1200. In an aspect, the method 1200 may be performed by a system, such as the system 1100 of FIG. 11. For example, steps of the method 1200 may be stored as instructions (e.g., the instructions 1146 of FIG. 11) that, when executed by one or more processors (e.g., the one or more processors 1142 of FIG. 11), cause the one or more processors to perform the steps of the method 1200.

As shown in FIG. 12, the method 1200 includes, at step 1210 compiling, by a processor, input data for initializing a PF model. Exemplary aspects of input data that may be utilized to initialize the PF model are described in more detail below. Additionally, the method 1200 may include, at step 1220, executing, by the processor, a simulation of the PF model based at least in part on the compiled input data. In an aspect, the simulation of the PF model may include, at step 1222, calculating soot characteristics representative of soot present in the PF, and at step 1224, determining a 3D temperate estimate for the PF based on the soot characteristics, information associated with physical characteristics of the PF, and one or more reaction parameters. In an aspect, the 3D temperature estimate may be determined using one or more algebraic solutions according to a Euler methodology. The Euler methodology may be a Euler explicit methodology or a Euler implicit methodology, as described in more detail below. The information associated with the physical characteristics of the PF may comprise a representation of a volume of the PF, which may have one or more cells, each of the one or more cells corresponding to a portion of the volume of the PF. In an aspect, the method 1200 may also include executing a plurality of additional simulations of the PF model, and the oxidation event may be initiated based on the simulation and the plurality of additional simulations.

The method 1200 also includes, at step 1230, initiating an oxidation event at the PF based on the simulating. In an aspect, the method 1200 may also include determining an optimized time for initiating the oxidation event at the PF based on the simulation or both the simulation and the plurality of additional simulations. The optimized time for initiating the oxidation event may be determined, based at least in part, on 3D temperature estimates for the PF determined by the simulation alone or based on both the simulation and the plurality of additional simulations. In the description that follows, various exemplary operations and techniques for modelling PFs in accordance with the present disclosure are described.

As briefly described above, GPF modelling processes of the present disclosure may utilize a plurality of inputs. The inputs to the GPF model may be compiled into a particular format. To illustrate, the inputs may be compiled into a comma separated value document (.csv) having a plurality of columns. In an exemplary aspect, the compiled inputs may be arranged into five columns. The first column may contain timing information, which may be indicated in 0.1 second intervals, from a first time (t) (e.g., t=0) to an end time (e.g., t=T) for the compiled data. The second column may contain data received from a sensor (e.g., one of the sensors 1130 of FIG. 11), such as a linear lambda ($\lambda_1$) sensor. The third column may contain a mole fraction of oxygen entering the GPF, which may be derived based on information obtained from the lambda sensor. The fourth column may contain the mass flow rate into the GPF in kilograms per second at the respective time step. The temperature of the gas entering the GPF may be stored in the final column in Kelvin. Once the input data is compiled (e.g., converted into a desired format, it may be used in the GPF model.

Based on the compiled inputs, the model (or modelling program) may perform various calculations to determine other species concentrations, which may ensure model consistency (e.g., with the actual experiments). In an aspect, a lean combustion regime is assumed for the engine and the outputs may be computed as follows:

$$C_xH_y + a(O_2 + 3.76N_2) \rightarrow bCO_2 + cH_2O + dO_2 + eN_2 \quad (1)$$

Because of the need to simulate gasoline (having a stoichiometric air-to-fuel ratio around 14.7), the values of x and y may be estimated. In an exemplary calculation, these values were estimated to be:

$$x = 8.5 \quad (2)$$

$$y = 17 \quad (3)$$

Then, the stoichiometric combustion reaction may be balanced which may produce the following values:

$$b = x \quad (4)$$

$$c = y/2 \quad (5)$$

$$a_{ST} = (2b+c)/2 \quad (6)$$

and a check of the stoichiometric AF ratio:

$$AF_{ST} = \frac{a_{ST}(32 + 3.76 \cdot 28)}{12x + y} \quad (7)$$

Using the lambda sensor information, the actual AF ratio may be calculated as:

$$AF = AF_{ST} \cdot \lambda_1 \quad (8)$$

The number of moles of air may also be calculated using the molecular weights of carbon, hydrogen, oxygen, and nitrogen as follows:

$$a = \frac{AF \cdot (12x + y)}{(32 + 3.76 \cdot 28)} \quad (9)$$

This value may then be used to find the amount of oxygen and nitrogen with the oxygen value simply used to provide representative $CO_2$ and $H_2O$ mole fractions:

$$d = \frac{2a - 2b - c}{2} \quad (10)$$

$$e = 3.76a \quad (11)$$

where d is set equal to zero if the calculation indicates it is less than zero. Note that the mole fraction of $O_2$ ($x_{O_2}$) may come directly from the input file and the lambda sensor. Finally, the mole fractions of the remaining species may be calculated as follows:

$$X_{CO_2} = \frac{b}{b + c + d + e} \quad (12)$$

$$X_{H_2O} = \frac{c}{b + c + d + e} \quad (13)$$

$$X_{CO} = 0 \quad (14)$$

$$X_{N_2} = 1 - (X_{CO_2} + X_{H_2O} + X_{O_2} + X_{CO}) \quad (15)$$

Figure 1:
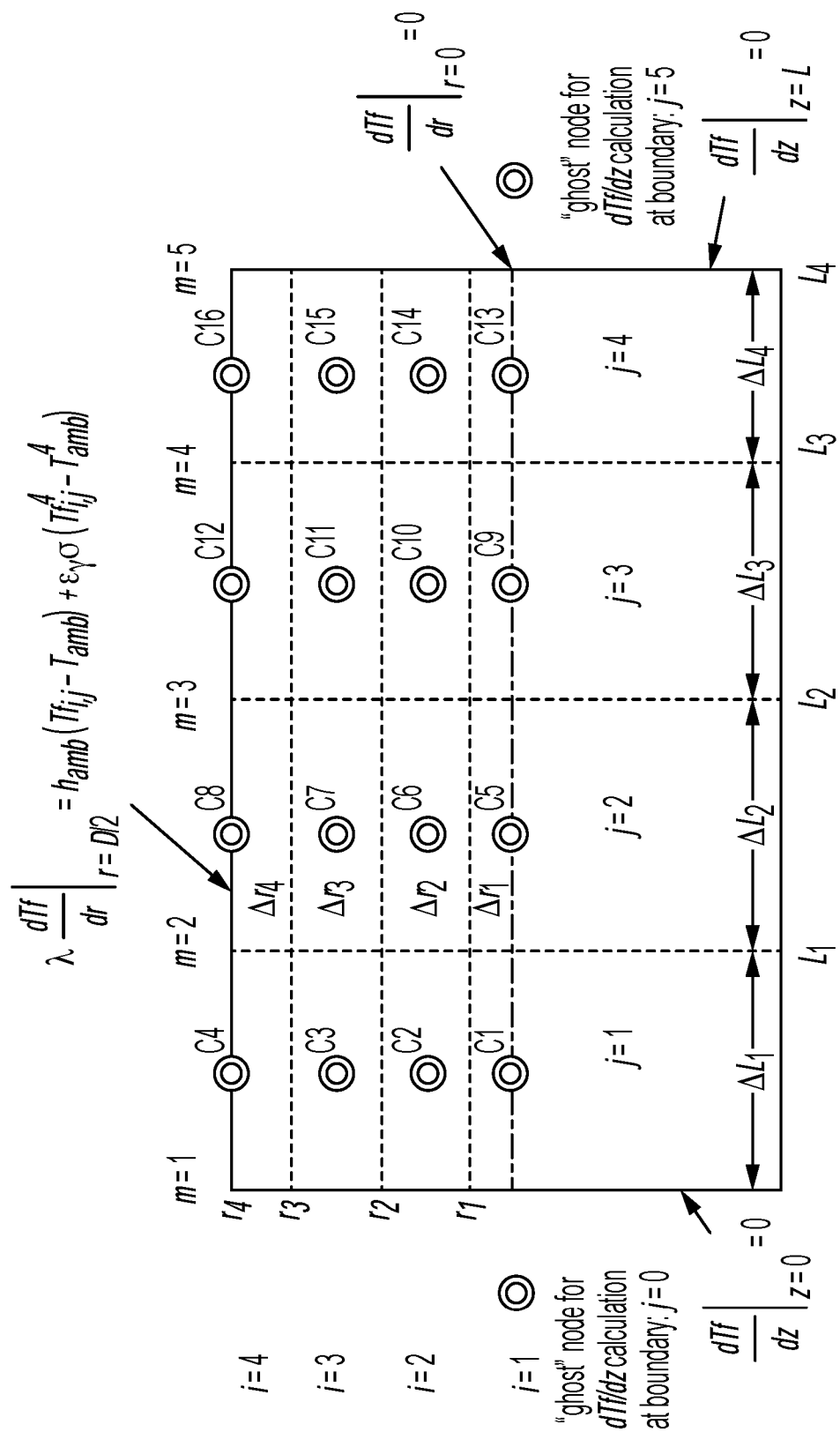
FIG. 1 is a schematic of the lumped PF model depicting the boundary conditions, important lengths, and subscript nomenclature in accordance with aspects of the present disclosure.

The PF may be modelled in a lumped resistance-capacitance (R-C) manner as seen in FIG. 1. The channel species and velocity are indexed along the (m) vector. In the model, m=1 is the entrance of the inlet channel and the closed end of the outlet channel; whereas, m=5 is the end of the inlet channel and the exit of the outlet channel. The temperature of the filter itself is indexed via the (i,j) matrix, where (i) represents the position in the radial direction and (j) represents the position in the axial direction. Separate indexes are used for the filter and the channel because previous efforts determined that modeling the temperature through the R-C network was sufficient for accuracy; however, the chemical species needed to be simulated via the more traditional channel approach to retain precision.

With the PF now divided in the radial and axial directions, the model simulations may begin by calculating the needed physical parameters. Following these calculations, iteration over time can then begin. For each discrete time step, the species concentrations, temperatures, and soot mass are determined at each relevant point throughout the PF system.

To begin, the physical size of the different components of the PF that are relevant to the calculations are determined. As shown in FIG. 1, the total volume (V) of each R-C node can be found via:

$$V_{i,j} = \pi(r_i^2 - r_{i-1}^2)\Delta L_j \quad (16)$$

where (r) is the radius of the filter and (L) is the length of the filter. The change in the axial direction ($\Delta L$) for each node is calculated as:

$$\Delta L_j = L_j - L_{j-1} \quad (17)$$

Changes in the radial direction ($\Delta r$) are similarly calculated by:

$$\Delta r_i = r_i - r_{i-1} \quad (18)$$

For Eqn. (17) and (18), it is important to note that $r_0$ and $L_0$ are equal to zero. With the cell density (N) of the PF known, the number of cells in each R-C node (Nc) can be calculated as:

$$Nc_i = \pi(r_i^2 - r_{i-1}^2)N \quad (19)$$

Next, the empty volume of each node (Ve) can be found. This is the amount of volume not occupied by the filter (aka the volume of the gas) in each respective (i, j) node:

$$Ve_{i,j} = Nc_i d^2 \Delta L_j \quad (20)$$

The volume of the filter (Vf) can be determined now that the total volume of the node (V) and empty volume are known. In an aspect, Vf may be calculated as:

$$Vf_{i,j} = V_{i,j} - Ve_{i,j} \quad (21)$$

Once the relative volume of each node is known, the initial soot loading through the PF can be determined. In an aspect, it may be assumed that the soot is evenly distributed throughout the PF. This leads to the soot mass per node (ms), which may be calculated as:

$$m_{i,j} = \frac{ms_t \cdot V_{i,j}}{V_t} \quad (22)$$

where $ms_t$ is the total mass of soot loaded (specified at the beginning of the simulation) and $V_t$ is the total volume of the PF. Once the calculation of physical parameters and initial guesses are complete, the code can move on to the calculation of important parameters throughout the PF at all time steps.

The model may loop for each time step of data that is made available. Alternatively, these calculations could be run in real time to predict the oxidation of soot within the PF. As the modelling program steps through each time step, certain values may be calculated or updated. For example, there are a few characteristics of the geometry of the PF that may change with time due to soot mass (ms) oxidation. The thickness of the soot (ts) in each node can be found from the amount of soot in each node as follows:

$$ts_{i,j} = \frac{1}{2}\left[d - \sqrt{d^2 - \frac{ms_{i,j}}{\left(\frac{Nc_i}{2}\right)\Delta L_j \rho_s}}\right] \quad (23)$$

Once the amount of space the soot occupies is determined, the empty volume in the cell (Ves) can be determined (accounting for the soot loading) by:

$$Ves_{i,j} = \frac{Nc_i}{2}\left[(d - 2ts_{i,j})^2 + d^2\right]\Delta L_j \quad (24)$$

This value may be combined with the other known volumes, which makes it possible to find the volume of the soot (Vs) in the PF for each node according to:

$$Vs_{i,j} = V_{i,j} - V_{f_{i,j}} - Ves_{i,j} \quad (25)$$

The soot volume is the last volume value that needs to be determined before iteration throughout the PF can begin. However, there a few more parameters that may be solved for the R-C temperature network. These may include the channel surface area (As) and the average cross-sectional area ($\overline{A}$), which may be calculated according to:

$$As_{i,j} = \frac{Nc_i}{2}[4(d - 2ts_{i,j}) + 4d]\Delta L_j \quad (26)$$

$$\overline{A}_{i,j} = \frac{1}{2}\left[(d - 2ts_{i,j})^2 + d^2\right] \quad (27)$$

At this point, an overall consideration is made regarding the model dimensionality. Specifically, up to this point the model has been developed in three-dimensions (3-D) with zones in the radial direction. However, development of the simplest and fastest model may be desired. Therefore, a simplification to one-dimension may be made and a single representative channel can be used for the chemical species. As a result, the model must then determine the average soot thickness through the filter using all of the soot in the filter, which may be determined according to:

$$\overline{ts} = \frac{1}{2}\left[d - \sqrt{d^2 - \frac{ms_t}{\left(\frac{Nc_i}{2}\right)\Delta L_t \rho_s}}\right] \quad (28)$$

This information may be used to calculate the average velocity of the gas through the soot layer ($u_s$) as follows:

$$u_s = \frac{\dot{m}_{total}}{4\rho \frac{Nc_i}{2}(d - 2 \cdot \overline{ts})L_t} \quad (29)$$

The velocity of the fluid in the soot layer is important for determining how the chemical species change as they pass through the soot layer. Additionally, the average velocity in the wall ($u_w$) may be calculated, as it may aid in simulation of the chemical species in the wall layer. The average velocity in the wall may be calculated according to:

$$u_w = \frac{u_s(d - 2 \cdot \overline{ts})}{d} \quad (30)$$

Following, representative inlet channel (I) and outlet channel (II) velocities may be determined via the (m) indexing while assuming dynamically incompressible flow according to:

$$u_I \mid_m = u_I \mid_{m-1} - \frac{4u_s \Delta L_m}{d - 2 \cdot \bar{t}s} \tag{31}$$

$$u_{II} \mid_m = u_{II} \mid_{m-1} + \frac{4u_w \Delta L_m}{d} \tag{32}$$

The boundary conditions of these channel velocities may be calculated as:

$$u_I \mid_{m=1} = \frac{\dot{m}_{in}}{\rho_g \left(\frac{Nc_t}{2}\right)(d - 2\bar{t}s)^2} \tag{33}$$

$$u_{II} \mid_{m=1} = 0 \tag{34}$$

In embodiments for a 3-D version, Eqn. (23) should be used to determine $u_s$, $u_w$, $u_I$, and $u_{II}$ in each (i,j) zone. Moreover, then the chemical species derivation in the next section should include values for each zone. However, a single representative channel for the chemical species may be assumed; hence, the methodology starting with Eqn. (28) is valid.

The equations used to determine the change in chemical species within the PF model are all derived from the fundamental Conservation of Species equations. Here, the model starts with the governing equation for the inlet channel:

$$\frac{\partial(\rho_I u_I Y_I)}{\partial z} = -\frac{4}{d - 2 \cdot \bar{t}s} [k_m(\rho_I Y_I - \rho_l Y_s \mid_{y=0}) + \rho_l u_s Y_I] \tag{35}$$

Using the product rule on the left hand side (LHS) of the equation produces the following:

$$\rho_I u_I \frac{\partial(Y_I)}{\partial z} + Y_I \frac{\partial(\rho_I u_I)}{\partial z} = -\frac{4}{d - 2 \cdot \bar{t}s} [k_m(\rho_I Y_I - \rho_l Y_s \mid_{y=0}) + \rho_l u_s Y_I] \tag{36}$$

Bringing in the Conservation of Mass from the inlet channel into the analysis yields:

$$\frac{d(\rho_I u_I)}{dz} = -\frac{4 \rho_l u_s}{d - 2 \cdot \bar{t}s} \tag{37}$$

This equation can be substituted into Eqn. (36) to simplify the Conservation of Species equation:

$$\rho_I u_I \frac{\partial(Y_I)}{\partial z} - \frac{4\rho_l u_s Y_I}{d - 2 \cdot \bar{t}s} = -\frac{4}{d - 2 \cdot \bar{t}s} [k_m(\rho_I Y_I - \rho_l Y_s \mid_{y=0}) + \rho_l u_s Y_I] \tag{38}$$

by first expanding out the right hand side (RHS):

$$\rho_I u_I \frac{\partial(Y_I)}{\partial z} - \frac{4\rho_l u_s Y_I}{d - 2 \cdot \bar{t}s} = -\frac{4k_m(\rho_I Y_I - \rho_l Y_s \mid_{y=0})}{d - 2 \cdot \bar{t}s} - \frac{4\rho_l u_s Y_I}{d - 2 \cdot \bar{t}s} \tag{39}$$

and then simplifying:

$$\rho_I u_I \frac{\partial Y_I}{\partial z} = -\frac{4k_m(\rho_I Y_I - \rho_l Y_s \mid_{y=0})}{d - 2 \cdot \bar{t}s} \tag{40}$$

At this point, the governing equation can be further reduced by applying the dynamically incompressible flow assumption. This is a valid assumption when there are small to moderate changes in pressure and temperature throughout the channels. Hence, applying this assumption allows for the cancellation of the density terms throughout, which yields:

$$\frac{dY_I}{dz} = -\frac{4k_m(Y_I - Y_s \mid_{y=0})}{u_I(d - 2 \cdot \bar{t}s)} \tag{41}$$

Previous efforts have employed an Ordinary Differential Equation (ODE) solver to determine the species mass fractions in the inlet channel. However, it advantageous to remove these solver functions in favor of algebraic solutions, since the algebraic solutions enable real-time execution by an onboard computing device of a vehicle, such as the EMS 1140 of FIG. 11. Therefore, an Explicit Euler methodology for its solution can be used, which may be expressed as:

$$\frac{Y_I \mid_{z+\Delta z} - Y_I \mid_z}{\Delta z} = -\frac{4k_m(Y_I \mid_z - Y_s \mid_{y=0,z})}{u_I \mid_z (d - 2 \cdot \bar{t}s)} \tag{42}$$

At this point, the species concentrations at the boundary of the inlet channel and soot may be examined. The equation for this boundary condition at (y=0) may be expressed as follows:

$$k_m(\rho_I Y_I - \rho_l Y_i) + \rho_l u_s Y_I = \rho_s u_s Y_s + \rho_s V_s Y_s \tag{43}$$

In this expression, the mass transfer to the surface by Fick's diffusion and via advection is balanced by the advection away from the boundary and the diffusion within the soot layer. Because the solution of diffusion involves the requirement of an iterative routine and its impact can be neglected under certain scenarios, it is assumed negligible here for simplicity. As a result, Eqn. (43) can be solved for the mass fractions in the soot layer at the interface (y=0) as:

$$Y_s \mid_{y=0} = \frac{k_m \rho_I Y_I + \rho_l u_s Y_I}{\rho_s u_s + k_m \rho_l} \tag{44}$$

Then, again assuming dynamic incompressibility results in:

$$Y_s \mid_{y=0} = \frac{k_m Y_I + u_s Y_I}{u_s + k_m} \tag{45}$$

Equation 45 may then be simplified to:

$$Y_s \mid_{y=0} = Y_I \tag{46}$$

Combining this result with Eqn. (41) yields an equation for calculating the species mass fraction in the first channel, which may be expressed as:

$$\frac{dY_I}{dz} = 0 \tag{47}$$

The governing equation for chemical species in the inlet channel may be converted into molar format as follows:

$$\frac{dX_l}{dz} = 0 \tag{48}$$

Similarly, the derivation of species mass fraction in the soot layer begins from the fundamental governing equation:

$$\frac{\partial(\rho_l u_s Y_s A_s)}{\partial y} + \frac{\partial(\rho_l Y_s V_s A_s)}{\partial y} = \dot{S}_s A_s \tag{49}$$

Since diffusion was neglected at the interface, it may be assumed insignificant here as compared to the magnitude of change that occurs due to advection. This assumption allows the second term of the left side of the equation to be dropped, which yields:

$$\frac{\partial(\rho_l u_s Y_s A_s)}{\partial y} = \dot{S}_s A_s \tag{50}$$

Using the product rule to expand the LHS allows further simplification:

$$\rho_l u_s A_s \frac{\partial(Y_s)}{\partial y} + Y_s \frac{\partial(\rho_l u_s A_s)}{\partial y} = \dot{S}_s A_s \tag{51}$$

The Conservation of Mass equation throughout the soot layer becomes:

$$\frac{\partial(\rho_l u_s A_s)}{\partial y} = 0 \tag{52}$$

Incorporating this result into Eqn. (51):

$$\rho_l u_s A_s \frac{\partial(Y_s)}{\partial y} = \dot{S}_s A_s \tag{53}$$

which may be further simplified as:

$$\frac{dY_s}{dy} = \frac{\dot{S}_s}{\rho_l u_s} \tag{54}$$

The production rate of the species comes from the combustion reactions. However, as stated previously, it is important to convert this into the molar format of the Conservation of Species for consistency in comparison between different models, which may be expressed as:

$$\frac{dX_s}{dy} = \frac{\overline{S}_s}{\overline{\rho}_l u_s} \tag{55}$$

where the units for the reaction rate terms (S) are [mol m$^{-3}$ s$^{-1}$].

It may be desired to include four soot combustion reactions involving both high temperature ($k_1$ and $k_2$) and low temperature soot kinetics ($k_3$ and $k_4$), which may be expressed as:

(56)

(57)

where the reaction rates are written using the Arrhenius expression:

$$k_j = A_j \exp[-E_j/(R_u \cdot Tf_m)] \tag{58}$$

with units on the A terms as [m s$^{-1}$]. Since these combustion reactions are dependent on the local oxygen level, writing Eqn. (55) as a function of the oxygen conversion rate yields:

$$\frac{dX_{s,O_2}}{dy} = \frac{\overline{S}_{s,O_2}}{\overline{\rho}_l u_s} \tag{59}$$

where the units on the (S) expression are [mol O$_2$ m$^{-3}$ s$^{-1}$]. Including all four expressions results in:

$$\overline{S}_{s,O_2} = -S_P \overline{\rho}_T X_{s,O_2}(k_1 + k_2 + k_3 + k_4) \tag{60}$$

Incorporating this result into Eqn. (59) yields:

$$\frac{dX_{s,O_2}}{dy} = \frac{-S_P X_{s,O_2}(k_1 + k_2 + k_3 + k_4)}{u_s} \tag{61}$$

It may be important to understand the model prediction type at this point. For DPF modeling efforts, a linear dependency on O$_2$ is used; whereas, for GPF simulations, there is a power-order on the O$_2$ mole fraction, which may be expressed as:

$$\frac{dX_{s,O_2}}{dy} = \frac{-S_P X_{s,O_2}^n(k_1 + k_2 + k_3 + k_4)}{u_s} \tag{62}$$

Therefore, moving forward the derivation takes into account the power order dependency. But, the same methodology is employed. Specifically, a separation of variables may be used, yielding:

$$\frac{dX_{s,O_2}}{X_{s,O_2}^n} = \frac{-S_P(k_1 + k_2 + k_3 + k_4)}{u_s} dy \tag{63}$$

This result may then integrated over the distance in the soot layer according to:

$$\int_{X_{s,O_2}|_{in}}^{X_{s,O_2}} \frac{dX_{s,O_2}}{X_{s,O_2}^n} = \int_0^y \frac{-S_P(k_1 + k_2 + k_3 + k_4)}{u_s} dy \tag{64}$$

which can be solved for how the O$_2$ mole fraction changes in the soot layer when n=1 and when n=0.85 (=17/20), respectively:

$$X_{s,O_2}(y) = X_{s,O_2}\Big|_{in} \exp\left[\frac{-S_p(k_1+k_2+k_3+k_4)y}{u_s}\right] \quad n=1 \tag{65}$$

$$X_{s,O_2}(y) = \left[X_{s,O_2}\Big|_{in}^{\frac{3}{20}} - \frac{3S_p(k_1+k_2+k_3+k_4)y}{20u_s}\right]^{\frac{20}{3}} \quad n=0.85 \tag{66}$$

and substituting $y=\overline{ts}$ results in the value for $O_2$ mole fraction exiting the soot layer. The results for $n=0.85$ can be made more general by using the following variables:

$$m_n = 1 - n \tag{67}$$

$$q_n = \frac{1}{1-n} \tag{68}$$

$$v_n = 1 + q_n \tag{69}$$

$$z_n = \frac{2-n}{(1-n)^2} \tag{70}$$

$$\alpha = X_{s,O_2}\Big|_{in}^{m_n} \tag{71}$$

$$\beta = \frac{S_p(k_1+k_2+k_3+k_4)}{u_s} \tag{72}$$

The variables identified in Expressions 68-72 are used to simplify the previously discussed equations (e.g., Equations 65 and 66). Hence, Eqn. (65) and (66) are generally equal to:

$$X_{s,O_2}(y) = X_{s,O_2}\Big|_{in} \exp(-\beta y) \quad n=1 \tag{73}$$

$$X_{s,O_2}(y) = (\alpha - \beta \cdot m_n \cdot y)^{q_n} \tag{74}$$

However, in the soot mass and exothermic reaction expressions indicated later it is more pertinent to use an average oxygen mole fraction through the layer. Therefore, an average mole fraction may be used and these expressions may be defined as:

$$\overline{X}_{s,O_2} = \frac{1}{\overline{ts}} \int_0^{\overline{ts}} X_{s,O_2}(y) \tag{75}$$

This results in:

$$\overline{X}_{s,O_2} = \frac{X_{s,O_2}\Big|_{in}\left(1 - e^{-\beta \overline{ts}}\right)}{\beta \cdot \overline{ts}} \tag{76}$$

$n = 1$ $$\overline{X}_{s,O_2} = \frac{3\left[\alpha^{\frac{23}{3}} - (\alpha - \beta \cdot m_n \cdot \overline{ts})^{\frac{23}{3}}\right]}{23\beta \cdot m_n \cdot \overline{ts}} \tag{77}$$

$n = 0.85$

For a variable n, this can be written as follows:

$$\overline{X}_{s,O_2} = \frac{\alpha^{v_n} - (\alpha - \beta \cdot m_n \cdot \overline{ts})^{v_n}}{v_n \cdot \beta \cdot m_n \cdot \overline{ts}} \tag{78}$$

Going back to Eqn. (55), one can write the production of $CO_2$ within the soot layer as follows (analogous to Eqn. (59)):

$$\frac{dX_{s,CO_2}}{dy} = \frac{\overline{S}_{s,CO_2}}{\overline{p}_l u_s} \tag{79}$$

and including the pertinent $CO_2$ reactions ($k_1$ and $k_3$) recovers:

$$\overline{S}_{s,CO_2} = S_p \overline{p}_l X_{s,O_2}(k_1+k_3) \tag{80}$$

with the units as [mol $CO_2$ m$^{-3}$ s$^{-1}$]. Including this in the $CO_2$ production equation results in:

$$\frac{dX_{s,CO_2}}{dy} = \frac{S_p X_{s,O_2}(k_1+k_3)}{u_s} \tag{81}$$

Now, the separation of variables can be employed, yielding:

$$dX_{s,CO_2} = \frac{S_p(k_1+k_3)}{u_s} X_{s,O_2} dy \tag{82}$$

The expressions for the mole fraction of oxygen as a function of the y-distance dependent on the power order, respectively, are brought back (Eqn. (65) or (66)) according to:

$$dX_{s,CO_2} = \frac{S_p(k_1+k_3)}{u_s} X_{s,O_2}\Big|_{in} \exp\left[\frac{-S_p(k_1+k_2+k_3+k_4)y}{u_s}\right] dy \tag{83}$$

$n = 1$ $$dX_{s,CO_2} = \varphi(\alpha - \beta \cdot y \cdot m_n)^{\frac{17}{3}} dy \tag{84}$$

$n = 0.85$ with:

$$\varphi = \frac{S_p(k_1+k_3)}{u_s} \tag{85}$$

Now, using integration over the distance makes it possible to find the mole fractions of $CO_2$ leaving the filter, which may be expressed as:

$$\int_{X_{s,CO_2}|_{in}}^{X_{s,CO_2}|_{out}} dX_{s,CO_2} = \tag{86}$$

$$\int_0^{\overline{ts}} \frac{S_p(k_1+k_3)}{u_s} X_{s,CO_2}\Big|_{in} \exp\left[\frac{-S_p(k_1+k_2+k_3+k_4)y}{u_s}\right] dy \quad n=1$$

$$\int_{X_{s,CO_2}|_{in}}^{X_{s,CO_2}|_{out}} dX_{s,CO_2} = \int_0^{\overline{ts}} \varphi(\alpha - \beta \cdot y \cdot m_n)^{\frac{17}{3}} dy \quad n = 0.85 \tag{87}$$

This results in:

$$X_{s,CO_2}\Big|_{out} = X_{s,CO_2}\Big|_{in} + X_{s,O_2}\Big|_{in} \tag{88}$$

$$\left\{1 - \exp\left[\frac{-S_p(k_1+k_2+k_3+k_4)\overline{ts}}{u_s}\right]\right\} \frac{k_1+k_3}{k_1+k_2+k_3+k_4} \quad n=1$$

$$X_{s,CO_2}|_{out} = X_{s,CO_2}|_{in} + \frac{\varphi}{\beta}\left[X_{s,O_2}|_{in} - (\alpha - \beta \cdot m_n \cdot \overline{ts})^{\frac{20}{3}}\right] \quad n = 0.85 \quad (89)$$

Generally, the variable n version can be written as:

$$X_{s,CO_2}|_{out} = X_{s,CO_2}|_{in} + \frac{\varphi}{\beta}\left[X_{s,O_2}|_{in} - (\alpha - \beta \cdot m_n \cdot \overline{ts})^{q_n}\right] \quad (90)$$

An average mole fraction for $CO_2$ may also be defined:

$$\overline{X}_{s,CO_2} = \frac{1}{\overline{ts}}\int_0^{\overline{ts}} X_{s,CO_2}(y) \quad (91)$$

This results in:

$$\overline{X}_{s,CO_2} = X_{s,CO_2}|_{in} + \varphi X_{s,O_2}|_{in}\left(\frac{e^{-\beta \cdot \overline{ts}} - 1 + \beta \cdot \overline{ts}}{\beta^2 \cdot \overline{ts}}\right) \quad (92)$$

$n = 1$ $$\overline{X}_{s,CO_2} = X_{s,CO_2}|_{in} - \varphi\left[\frac{\alpha^{v_n} - (\alpha - \beta \cdot m_n \cdot \overline{ts})^{v_n}}{z_n \cdot \beta^2 \cdot m_n^2 \cdot \overline{ts}} - \frac{\alpha^{q_n}}{\beta \cdot m_n \cdot q_n}\right] \quad (93)$$

Finally, going back to Eqn. (55), one can write the production of CO within the soot layer as follows (analogous to Eqn. (59)):

$$\frac{dX_{s,CO}}{dy} = \frac{\overline{S}_{s,CO}}{\overline{\rho}_l u_s} \quad (94)$$

and including the pertinent CO reactions ($k_2$ and $k_4$) recovers:

$$\overline{S}_{s,CO} = S_p \overline{\rho}_l X_{s,O_2}(2k_2 + 2k_4) \quad (95)$$

with the units as [mol CO m$^{-3}$ s$^{-1}$] and the "2" factor is because there are two moles of CO generated for every mole of $O_2$ combusted. Including this in the CO production equation results in:

$$\frac{dX_{s,CO}}{dy} = \frac{2S_p X_{s,O_2}(k_2 + k_4)}{u_s} \quad (96)$$

Employing the separation of variables yields:

$$dX_{s,CO} = \frac{2S_p(k_2 + k_4)}{u_s} X_{s,O_2} dy \quad (97)$$

Here, the expressions for the mole fraction of oxygen as a function of the y-distance dependent on the power order, respectively, are brought back (Eqn. (65) or (66)), yielding:

$$dX_{s,CO} = \frac{2S_p(k_2 + k_4)}{u_s} X_{s,O_2}|_{in} \exp\left[\frac{-S_p(k_1 + k_2 + k_3 + k_4)y}{u_s}\right] dy \quad (98)$$

$n = 1$ $$dX_{s,CO} = \phi(\alpha - \beta \cdot y \cdot m_n)^{\frac{17}{3}} dy \quad (99)$$

$n = 0.85$ with:

$$\phi = \frac{2S_p(k_2 + k_4)}{u_s} \quad (100)$$

Integrating over the distance to find the mole fractions of CO may leave:

$$X_{s,CO}|_{out} = X_{s,CO}|_{in} + X_{s,O_2}|_{in} \quad (101)$$

$$\left\{1 - \exp\left[\frac{-S_p(k_1 + k_2 + k_3 + k_4)\overline{ts}}{u_s}\right]\right\} \frac{2(k_2 + k_4)}{k_1 + k_2 + k_3 + k_4} \quad n = 1$$

$$X_{s,CO}|_{out} = X_{s,CO}|_{in} + \frac{\phi}{\beta}\left[X_{s,O_2}|_{in} - (\alpha - \beta \cdot m_n \cdot \overline{ts})^{\frac{20}{3}}\right] \quad n = 0.85 \quad (102)$$

Generally, the variable n version can be written as:

$$X_{s,CO}|_{out} = X_{s,CO}|_{in} + \frac{\phi}{\beta}\left[X_{s,O_2}|_{in} - (\alpha - \beta \cdot m_n \cdot \overline{ts})^{q_n}\right] \quad (103)$$

An average mole fraction for CO may also be defined:

$$\overline{X}_{s,CO} = \frac{1}{\overline{ts}}\int_0^{\overline{ts}} X_{s,CO}(y) \quad (104)$$

This results in:

$$\overline{X}_{s,CO} = X_{s,CO}|_{in} + \phi X_{s,O_2}|_{in}\left(\frac{e^{-\beta \cdot \overline{ts}} - 1 + \beta \cdot \overline{ts}}{\beta^2 \cdot \overline{ts}}\right) \quad (105)$$

$n = 1$ $$\overline{X}_{s,CO} = X_{s,CO}|_{in} - \phi\left[\frac{\alpha^{v_n} - (\alpha - \beta \cdot m_n \cdot \overline{ts})^{v_n}}{z_n \cdot \beta^2 \cdot m_n^2 \cdot \overline{ts}} - \frac{\alpha^{q_n}}{\beta \cdot m_n \cdot q_n}\right] \quad (106)$$

At this point, the species mole fractions leaving the soot layer have been determined. Following the soot layer, the gases flow into and through the wall layer. However, because this model does not include deep bed filtration, there are no changes to the species concentrations in this layer since no soot oxidation occurs. Therefore, $$\frac{dY_w}{dy} = \frac{dX_w}{dy} = 0 \quad (107)$$

and at the interface:

$$Y_w|_m = Y_s|_m \rightarrow X_w|_m = X_s|_m \quad (108)$$

Again, it important to note that the previous equations for species are for each individual m index value.

Finally, the fluid will flow through the wall and into the outlet channel. The change in species equations in the outlet channel are derived from the Conservation of Species equation:

$$\frac{\partial(\rho_{II} u_{II} Y_{II})}{\partial z} = -\frac{4}{d}\left[k_m(\rho_{II} Y_{II} - \rho_w Y_w |_{y=\overline{ts}+tw}) - \rho_w u_w Y_w |_{y=\overline{ts}+tw}\right] \quad (109)$$

Expanding the LHS of this equation via the product rule generates a version:

$$\rho_{II} u_{II}\frac{\partial(Y_{II})}{\partial z} + Y_{II}\frac{\partial(\rho_{II} u_{II})}{\partial z} = \quad (110)$$

$$-\frac{4}{d}\left[k_m(\rho_{II} Y_{II} - \rho_w Y_w |_{y=\overline{ts}+tw}) - \rho_w u_w Y_w |_{y=\overline{ts}+tw}\right]$$

Using the Conservation of Mass equation for the outlet channel, which may be expressed as:

$$\frac{d(\rho_{II} u_{II})}{dz} = \frac{4\rho_w u_w}{d} \quad (111)$$

Eqn. (110) may be simplified as follows:

$$\rho_{II} u_{II}\frac{\partial(Y_{II})}{\partial z} + Y_{II}\frac{4\rho_w u_w}{d} = \quad (112)$$

$$-\frac{4}{d}k_m(\rho_{II} Y_{II} - \rho_w Y_w |_{y=\overline{ts}+tw}) + \frac{4}{d}\rho_w u_w Y_w |_{y=\overline{ts}+tw}$$

Assuming dynamic incompressibility and grouping terms with similar constant values results in:

$$\frac{dY_{II}}{dz} = -\frac{4}{d \cdot u_{II}}\left[(k_m + u_w)(Y_{II} - Y_w |_{y=\overline{ts}+tw})\right] \quad (113)$$

Now, the first node of the outlet channel can be derived. However, the boundary condition between the outlet channel and the wall must first be considered:

$$\rho_w u_w Y_w + \rho_w V_w Y_w = -k_m(\rho_u Y_u - \rho_w Y_w) + \rho_w u_w Y_w \quad (114)$$

Specifically, the advection and diffusion of species within the wall layer must be balanced by the mass transfer as a function of Fick's law along with the advection away from the wall. Similar to the inlet channel boundary, diffusion will be neglected in the wall resulting in:

$$\rho_w u_w Y_w = -k_m(\rho_u Y_u - \rho_w Y_w) + \rho_w u_w Y_w \quad (115)$$

As a result, this simplifies at the boundary to be:

$$Y_{II} |_{m=1} = \frac{\rho_w Y_w |_{m=1}}{\rho_{II}} \quad (116)$$

and after assuming dynamic incompressibility:

$$Y_{II}|_{m=1} = Y_w|_{m=1} \rightarrow X_{II}|_{m=1} = X_w|_{m=1} \quad (117)$$

Thus, at z=0, the initial mole fractions in the outlet channel will be equal to the mole fractions leaving the wall layer.

Moving on from the first node (z=0), the derivation becomes slightly more complex. Returning to the simplified form of the Conservation of Species Eqn. (113), the Conservation of Mass equation for the outlet channel must be included. Specifically, after assuming dynamically incompressible flow, expressed as:

$$\frac{du_{II}}{dz} = \frac{4u_w}{d} \quad (118)$$

that can be integrated to recover:

$$u_{II} = \frac{4u_w z}{d} + C \quad (119)$$

However, solving this expression to determine the constant C finds that at z=0, the velocity at the wall of the outlet channel is zero (a boundary condition). Therefore:

$$u_{II}(z) = \frac{4u_w z}{d} \quad (120)$$

Hence, there is now an expression for how the velocity in the outlet channel changes with distance. Then, writing Eqn. (113) in Euler Explicit format results in:

$$\frac{Y_{II}|_{z+\Delta z} - Y_{II}|_z}{\Delta z} = -\frac{4(k_m + u_w)}{d \cdot u_{II}|_z}(Y_{II}|_z - Y_w|_{y=\overline{ts}+tw,z}) \quad (121)$$

Using the overall model variables, Eqn. (121) can then be expressed as an expression for how the species change through the outlet channel as follows:

$$Y_{II}|_m = \frac{Y_{II}|_{m-1} u_{II}|_{m-1} d + 4\Delta L_{m-1}(k_m + u_w) Y_w|_m}{u_{II}|_{m-1} d + 4\Delta L_{m-1}(k_m + u_w)} \quad (122)$$

Interestingly, this is derived using mass fractions because of the need to stay consistent with the Conservation of Species equations (there is a conservation of mass). Ideally, here one would need to convert it to mole fractions to follow along with the other species equations; however, since the outlet channel species equations may not be used for any specific purposes in the model, the calculation may omitted from the model.

Of note, throughout the solution of the species mole fractions it is possible due to the use of kinetics that their summation results in mass fractions greater than one (1.000000001) or less than one (0.99999999). Hence, they are scaled appropriately throughout the solvers.

Before the temperature values throughout the PF are calculated, some of these values may be interpolated to find the corresponding (i,j) index values for species mass fractions:

$$X_s|_j = \tfrac{1}{2}(X_s|_{m=j} + X_s|_{m=j+1}) \quad (123)$$

Soot mass can be solved directly. The differential equation can be adapted as follows:

$$\frac{d(ms_{i,j})}{dt} = \frac{\dot{S}_{C_{(s)}}}{\rho_s} ms_{i,j} \quad (124)$$

where the $\dot{S}_{C_{(s)}}$ term is the overall soot combustion rate in $[kg_{C_{(s)}} m^{-3} s^{-1}]$. Reviewing the combustion expressions of Eqns. (80) and (95) while incorporating the potential to have a power order on the oxygen mole fraction, this term becomes:

$$\dot{S}_{C_{(s)}} = -S_p \bar{\rho}_l \overline{X}^n_{s,O_2} [(k_1+k_3) + 2(k_2+k_4)] W_{C_{(s)}} \quad (125)$$

Here, the negative sign indicates the loss of soot from the surface and the expression is converted from a molar format (i.e., $mol_{C_{(s)}}$ to a mass format by the use of the molecular weight (with a 1000 factor included to convert it from [gm/mol] to [kg/mol]). Thus, this equation indicates that for every mole of $O_2$ combusted, one mole of soot is converted via Eqn. (56); whereas, two moles are converted via Eqn. (57). Therefore, Eqn. (124) becomes:

$$\frac{d(ms_{i,j})}{dt} \frac{-S_p \bar{\rho}_l \overline{X}^n_{s,O_2} \big|_j [(k_1+k_3) + 2(k_2+k_4)] W_{C_{(s)}}}{\rho_s} ms_{i,j} = \chi \cdot ms_{i,j} \quad (126)$$

Equation 126 can be solved using the separation of variables:

$$\frac{d(ms_{i,j})}{ms_{i,j}} = \chi \cdot dt \quad (127)$$

and solving equation 127 yields:

$$ms_{i,j}^{t+1} = ms_{i,j}^t \exp(\chi \Delta t) \quad (128)$$

This equation may be recalculated for each position given the non-constant temperature distribution throughout the filter.

Soot Reaction Exothermic Expressions

Revisiting Eqn. (125), it can be broken up into the two reactions as follows:

$$\dot{S}_{C_{(s)}} = \dot{S}_{C_{(s)},CO_2} + \dot{S}_{C_{(s)},CO} \quad (129)$$

with:

$$\dot{S}_{C_{(s)},CO_2} = -S_p \bar{\rho}_l \overline{X}^n_{s,O_2}(k_1+k_3) W_{C_{(s)}} \quad (130)$$

$$\dot{S}_{C_{(s)},CO} = -2S_p \bar{\rho}_l \overline{X}^n_{s,O_2}(k_2+k_4) W_{C_{(s)}} \quad (131)$$

Again, with a 1000 factor to convert from moles to kilograms on the molecular weight. Then these expressions can be employed to find the soot reaction exothermic terms:

$$\dot{Q}_{reac} = -\frac{ms_{i,j}^{t+1}}{\rho_s}\left(\dot{S}_{C_{(s)},CO_2}\Delta H_{CO_2} + \dot{S}_{C_{(s)},CO}\Delta H_{CO}\right) \quad (132)$$

Notice that the updated soot mass is used to remain consistent with the Euler Implicit formulation.

Cerium Addition

The fundamental governing equation for simulating surface intermediates ($Ce_2O_3$ and $CeO_2$) comes from catalyst modeling and may be expressed as:

$$\frac{d\theta}{dt} = \frac{R}{\Gamma} \quad (133)$$

where $\theta$ is the coverage fraction of the surface intermediate of interest, R is the reaction rate of the expression being simulated in [mol m$^{-3}$ s$^{-1}$], and $\Gamma$ is the surface site density in [mol m$^{-3}$] for the entire filter. To simulate the governing chemical reaction expression, given by:

$$Ce_2O_3 + \tfrac{1}{2}O_2 \rightarrow 2CeO_2 \quad (134)$$

the reaction expression may be rewritten according to Langmuir isotherms as:

$$R_{Ce} = k_{Ce} p_{O_2}^{1/2}(\Gamma \theta_{Ce_2O_3}) \quad (135)$$

where $k_{C_e}$ is the Arrhenius expression with units that balance the reaction, which yields the coverage fraction for $Ce_2O_3$, expressed as:

$$\frac{d\theta_{Ce_2O_3}}{dt} = \frac{-k_{Ce} p_{O_2}^{1/2}(\Gamma \theta_{Ce_2O_3})}{\Gamma} = -k_{Ce} p_{O_2}^{1/2} \theta_{Ce_2O_3} \quad (136)$$

The other coverage fraction (e.g., the $CeO_2$ coverage fraction) may be written as:

$$\frac{d\theta_{CeO_2}}{dt} - \frac{2k_{Ce} p_{O_2}^{1/2}(\Gamma \theta_{Ce_2O_3})}{\Gamma} = \quad (137)$$
$$2k_{Ce} p_{O_2}^{1/2} \theta_{Ce_2O_3} = 2k_{Ce} p_{O_2}^{1/2}(1 - \theta_{CeO_2})$$

Given that there are only two coverage fractions, they should sum up to one. However, the reaction rate is exponential and the model requires a time history of $Ce_2O_3$ and $CeO_2$ in each section of the filter. Therefore, solving the governing equation, expressed as:

$$\frac{d\theta_{Ce_2O_3}}{dt} = -k_{Ce} p_{O_2}^{1/2} \theta_{Ce_2O_3} \quad (138)$$

would provide the time rate of change of $Ce_2O_3$ in each part of the filter; hence, an i,j subscript on $\theta$. A separation of variables may be performed according to:

$$\frac{d\theta_{Ce_2O_3}}{\theta_{Ce_2O_3}} = -k_{Ce} p_{O_2}^{1/2} dt \quad (139)$$

Integrating over time and from the initial surface coverage fraction to our final coverage fraction yields:

$$\int_{\theta_i}^{\theta_f} \frac{d\theta_{Ce_2O_3}}{\theta_{Ce_2O_3}} = -\int_0^{\Delta t} k_{Ce} p_{O_2}^{1/2} dt \quad (140)$$

Equation 140 then becomes:

$$\theta_{Ce_2O_3}(t) = \theta_{Ce_2O_3}|_i \exp(-k_{Ce} p_{O_2}^{1/2} \Delta t) \text{ and} \quad (141)$$

$$\theta_{CeO_2}(t) = 1 - \theta_{Ce_2O_3}(t) \quad (142)$$

An array of coverage fractions throughout the particulate filter may be created and solved algebraically as a function of time. Moreover, the array coverage fractions may enable backtracking and solving to be performed for a "stable" reaction rate according to:

$$\frac{d\theta_{Ce_2O_3}}{dt} = \frac{R_{Ce}}{\Gamma} \rightarrow R_{Ce} = \Gamma \frac{d\theta_{Ce_2O_3}}{dt} \quad (143)$$

Hence for each i,j:

$$R_{Ce} = \Gamma \frac{\theta_{Ce_2O_3}(t) - \theta_{Ce_2O_3}|_{i,j}}{\Delta t} \quad (144)$$

The oxygen storage effect appears to impact the temperature exothermic reaction. Particularly, the initial amount of $CeO_2$ influences how much the temperature rises. As a result, the exothermic heat generated by this reaction may be accounted for. Taking a cue from the PF modeling activities, this should equal:

$$\dot{Q}_{reac,Ce}{}^m = -R_{Ce} \Delta \overline{H}_{reac,Ce} \quad (145)$$

Since the reaction is in [mol m$^{-3}$ s$^{-1}$] and the heat of reaction is [kJ mol$^{-1}$], the units on this heat of reaction are currently: [kJ m$^{-3}$ s$^{-1}$] or [kW m$^{-3}$]. Therefore, multiplying this term by either (a) the filter volume in that particular section or (b) the total volume of the 3D filter provides the proper units. These two operations may be expressed as:

$$\dot{Q}_{reac,Ce} = -R_{Ce} \Delta \overline{H}_{reac,Ce} \cdot Vf_{i,j} \quad (146)$$

for multiplying by the filter volume in a particular section, or $$\dot{Q}_{reac,Ce} = -R_{Ce} \Delta \overline{H}_{reac,Ce} \cdot V_{i,j} \quad (147)$$

for multiplying by the total volume of the 3D filter. It may be assumed that the volume storage component mentioned is a function of the total volume of the filter.

The next step in the model is to determine the temperature in the filter/soot layer (Tf) and the corresponding gas temperature (T). To replace the ODE's found in previous works with a lower complexity, two numerical methods may be employed. Both the Euler Explicit and Euler Implicit methodologies were tested; however, the implicit method was ten times faster than the explicit method while also being inherently stable. As a result, the Euler Implicit method is described here.

Determining an equation for the temperature of the gas in the channels begins with a lumped energy equation, expressed as:

$$\rho_g c_p Ves_{i,j} \frac{dT_{i,j}}{dt} = \dot{Q}_{in} + \dot{Q}_{out} - \dot{Q}_{conv} \quad (148)$$

where the energy flows in and out are described as:

$$\dot{Q}_{in} = \dot{m}_{i,j} \cdot h_{i,j-1} \quad (149)$$

$$\dot{Q}_{out} = \dot{m}_{i,j} \cdot h_{i,j} \quad (150)$$

using the mass flow rates in and out of each zone. The convective heat transfer may be given by:

$$\dot{Q}_{conv} h_g As_{i,j}(T_{i,j} - Tf_{i,j}) \quad (151)$$

By assuming the temperature of the gas leaving the zones in the channels is the same temperature as the next time step, the equation can be simplified to the following equation:

$$\rho_g c_p Ves_{i,j} \frac{dT_{i,j}}{dt} = \dot{m}_{i,j} c_p (T_{i,j-1} - T_{i,j}) - \dot{Q}_{conv} \quad (152)$$

Stated another way, substituting Equation 149 and 150 into Equation 148 and then using the constant pressure specific heats instead of enthalpy will result in Equation 152. This equation can be rearranged and then solved using the Euler Implicit methodology as discussed earlier, which yields:

$$\frac{dT_{i,j}}{dt} = \frac{\dot{m}_{i,j} c_p (T_{i,j-1} - T_{i,j}) - h_g As_{i,j}(T_{i,j} - Tf_{i,j})}{\rho_g c_p Ves_{i,j}} \quad (153)$$

Rearranging terms on the right side to simplify the process of using Euler's implicit method results in the following equation:

$$\frac{dT_{i,j}}{dt} = \frac{\dot{m}_{i,j} c_p \Delta t}{\rho_g c_p Ves_{i,j}} T_{i,j-1} - \frac{\dot{m}_{i,j} c_p + h_g As_{i,j} \Delta t}{\rho_g c_p Ves_{i,j}} T_{i,j} + \frac{h_g As_{i,j} \Delta t}{\rho_g c_p Ves_{i,j}} Tf_{i,j} \quad (154)$$

After rearranging the equation, the solution for the gas temperature at the next time-step can be found:

$$T_{i,j}^{n+1} = \quad (155)$$

$$T_{i,j}^n + \frac{\dot{m}_{i,j} c_p \Delta t}{\rho_g c_p Ves_{i,j}} T_{i,j-1}^{n+1} - \frac{\dot{m}_{i,j} c_p \Delta t + h_g As_{i,j} \Delta t}{\rho_g c_p Ves_{i,j}} T_{i,j}^{n+1} + \frac{h_g As_{i,j} \Delta t}{\rho_g c_p Ves_{i,j}} Tf_{i,j}^{n+1}$$

Since the goal is to solve for the temperature (T) at the next time step ($^{n+1}$) those variables need to be isolated on the left hand side of the equation. The next two equations show the result of this simplification and then the results of cleaning up the equation.

$$T_{i,j}^{n+1} = \frac{T_{i,j}^n + \frac{\dot{m}_{i,j} c_p \Delta t}{\rho_g c_p Ves_{i,j}} T_{i,j-1}^{n+1} + \frac{h_g As_{i,j} \Delta t}{\rho_g c_p Ves_{i,j}} Tf_{i,j}^{n+1}}{1 + \frac{\dot{m}_{i,j} c_p \Delta t + h_g As_{i,j} \Delta t}{\rho_g c_p Ves_{i,j}}} \quad (156)$$

$$T_{i,j}^{n+1} = \frac{\frac{\rho_g c_p Ves_{i,j}}{\Delta t} T_{i,j}^n + \dot{m}_{i,j} c_p T_{i,j-1}^{n+1} + h_g As_{i,j} Tf_{i,j}^{n+1}}{\frac{\rho_g c_p Ves_{i,j}}{\Delta t} + \dot{m}_{i,j} c_p + h_g As_{i,j}} \quad (157)$$

To simplify the computation of the temperature (T), certain placeholder terms may be employed. Those values are listed here:

$$I = h_g \cdot As_{i,j} \quad (158)$$

$$J = \rho_g \cdot Ves_{i,j} \cdot c_p \quad (159)$$

$$K = \dot{m}_{i,j} \cdot c_p \quad (160)$$

followed by the final gas temperature (T) equation that is used in the model or modelling program at the first node of FIG. 1 $_{(j=1)}$:

$$T_{i,1}^{n+1} = \frac{\frac{J}{\Delta t}T_{i,1}^n + T_{in}K + Tf_{i,1}^{n+1}I}{\frac{J}{\Delta t} + K + I} \tag{161}$$

and throughout the rest of the filter:

$$T_{i,j}^{n+1} = \frac{\frac{J}{\Delta t}T_{i,j}^n + T_{i,j-1}^{n+1}K + Tf_{i,j}^{n+1}I}{\frac{J}{\Delta t} + K + I} \tag{162}$$

The process of determining the filter temperature (Tf) is very similar to the methodology used previously to determine the gas temperature (T). The derivation begins with the following traditional energy equation with an energy storage term:

$$(\rho_s c_s Vs_{i,j} + \rho_f c_f Vf_{i,j})\frac{dTf_{i,j}}{dt} = \tag{163}$$
$$\dot{Q}_{cond,axial} + \dot{Q}_{cond,radial} + \dot{Q}_{conv} + \dot{Q}_{wall} + \dot{Q}_{rec}$$

where the different heat transfer terms include axial conduction, radial conduction, convection, wall flow (ignored), $$\dot{Q}_{cond,axial} = \lambda_{i,j}Af_{i,j}\left[\frac{TF_{i,j+1} - Tf_{i,j}}{\frac{1}{2}(\Delta L_{j+1} + \Delta L_j)} + \frac{TF_{i,j-1} - Tf_{i,j}}{\frac{1}{2}(\Delta L_{j-1} + \Delta L_j)}\right] \tag{164}$$

$$\dot{Q}_{cond,radial} = \lambda_{i,j}Ar_{i,j}\left[\frac{TF_{i+1,j} - Tf_{i,j}}{\ln(rc_{i+1}/rc_i)} + \frac{TF_{i-1,j} - Tf_{i,j}}{\ln(rc_i/rc_{i-1})}\right] \tag{165}$$

$$\dot{Q}_{wall} = 0 \tag{166}$$

and the exothermic/endothermic reaction terms represented by the summation of Eqn. (132) and (147):

Following a similar methodology to the gas temperature (T), an Euler implicit solution to Eqn. (163) can be found. Moreover, solving for the temperature using the Euler Implicit method may include calculating the temperature at every point throughout the PF. Therefore, a numerical loop may be employed where both temperature values are solved at all points. This process may be repeated until convergence. In an aspect, convergence may be determined based on whether iterations of the loop result in temperatures that differ by less than 1e-5K (or 0.00001K).

When solving for the filter temperature, there are three equations that are used depending on the current location.

$$Tf_{1,1}^{n+1} = \frac{H + T_{1,1}^{n+1}I + \frac{E}{F}Tf_{1,2}^{n+1} + \frac{A}{\Delta t}Tf_{1,1}^n}{I + \frac{E}{F} + \frac{A}{\Delta t}} \tag{167}$$

$$Tf_{Zr,1}^{n+1} = \frac{H + T_{Zr,1}^{n+1}I + \left(\frac{E}{F}\right)Tf_{Zr,2}^{n+1} + \left(\frac{B}{D}\right)Tf_{Zr-1,1}^{n+1} + \left(\frac{A}{\Delta t}\right)Tf_{Zr,1}^n + T_{amb}P}{P + I + \frac{E}{F} + \frac{B}{D} + \frac{A}{\Delta t}} \tag{168}$$

$$Tf_{i,1}^{n+1} = \frac{H + T_{i,1}^{n+1}I + \left(\frac{E}{F}\right)Tf_{i,2}^{n+1} + B\left(\frac{Tf_{i+1,1}^{n+1}}{C} + \frac{Tf_{i-1,1}^{n+1}}{D}\right) + \left(\frac{A}{\Delta t}\right)Tf_{i,1}^n}{I + \frac{E}{F} + \frac{B}{C} + \frac{B}{D} + \frac{A}{\Delta t}} \tag{169}$$

These statements may be used to determine the value of (Tf) along the j=1 boundary. Similarly, the equations for determining its value at j=Za may be expressed as:

$$Tf_{1,Za}^{n+1} = \frac{H + T_{1,Za}^{n+1}I + \left(\frac{E}{G}\right)Tf_{1,Za-1}^{n+1} + \left(\frac{A}{\Delta t}\right)Tf_{1,Za}^n}{I + \frac{E}{F} + \frac{A}{\Delta t}} \tag{170}$$

$$Tf_{Zr,Za}^{n+1} = \frac{H + T_{Zr,Za}^{n+1}I + \left(\frac{B}{D}\right)Tf_{Zr-1,Za}^{n+1} + \left(\frac{E}{G}\right)Tf_{Zr,Za-1}^{n+1} + \left(\frac{A}{\Delta t}\right)Tf_{Zr,Za}^n + T_{amb}P}{P + I + \frac{B}{D} + \frac{E}{G} + \frac{A}{\Delta t}} \tag{171}$$

$$Tf_{i,Za}^{n+1} = \frac{H + T_{i,Za}^{n+1}I + B\left(\frac{Tf_{i+1,Za}^{n+1}}{C} + \frac{Tf_{i-1,Za}^{n+1}}{D}\right) + \left(\frac{E}{G}\right)Tf_{i,Za-1}^{n+1} + \left(\frac{A}{\Delta t}\right)Tf_{i,Za}^n}{I + \frac{B}{C} + \frac{B}{D} + \frac{E}{G} + \frac{A}{\Delta t}} \tag{172}$$

The final three equations for determining the temperature of the filter will determine the value at all other points not specified by the previous six equations.

$$Tf_{1,j}^{n+1} = \frac{H + T_{1,j}^{n+1}I + E\left(\frac{Tf_{1,j+1}^{n+1}}{F} + \frac{Tf_{1,j-1}^{n+1}}{G}\right) + \left(\frac{A}{\Delta t}\right)Tf_{1,j}^n}{I + \frac{E}{F} + \frac{E}{G} + \frac{A}{\Delta t}} \tag{173}$$

$$Tf_{Zr,j}^{n+1} = \frac{H + T_{Zr,j}^{n+1}I + \left(\frac{B}{D}\right)Tf_{Zr-1,j}^{n+1} + E\left(\frac{Tf_{Zr,j+1}^{n+1}}{F} + \frac{Tf_{Zr,j-1}^{n+1}}{G}\right) + \left(\frac{A}{\Delta t}\right)Tf_{Zr,j}^n + T_{amb}P}{P + I + \frac{B}{D} + \frac{E}{F} + \frac{E}{G} + \frac{A}{\Delta t}} \tag{174}$$

$$Tf_{i,j}^{n+1} = \frac{H + T_{i,j}^{n+1}I + B\left(\frac{Tf_{i+1,j}^{n+1}}{C} + \frac{Tf_{i-1,j}^{n+1}}{D}\right) + E\left(\frac{Tf_{i,j+1}^{n+1}}{F} + \frac{Tf_{i,j+1}^{n+1}}{G}\right) + \left(\frac{A}{\Delta t}\right)Tf_{i,j}^n}{I + \frac{B}{C} + \frac{B}{D} + \frac{E}{f} + \frac{E}{G} + \frac{A}{\Delta t}} \tag{175}$$

The variables A through H and P come from the equations used in the original temperature ODE that were adapted to this Euler Implicit methodology:

$$A = \rho_s c_s V_{s_{i,j}} + \rho_f c_f V_{f_{i,j}} \quad (176)$$

$$\lambda = \frac{\lambda_f V_{f_{i,j}} + \lambda_s V_{s_{i,j}}}{V_{f_{i,j}} + V_{s_{i,j}}} \quad (177)$$

$$B = 2\lambda \pi \Delta L_j \quad (178)$$

$$rc_i = \sum_{m=1}^{i-1} \Delta r_m + \frac{\Delta r_i}{2} \quad (179)$$

$$C = \ln(rc_{i+1}/rc_i) \quad (180)$$

$$D = \ln(rc_i/rc_{i-1}) \quad (181)$$

$$E = \lambda \left( \frac{V_{f_{i,j}} + V_{s_{i,j}}}{\Delta L_j} \right) \quad (182)$$

$$F = \frac{1}{2}(\Delta L_{j+1} + \Delta L_j) \quad (183)$$

$$G = \frac{1}{2}(\Delta L_j + \Delta L_{j-1}) \quad (184)$$

$$H = -\dot{Q}_{reac} \quad (185)$$

$$P = h_{amb} A_{amb} \quad (186)$$

$$A_{amb} = \pi D \Delta L_j \quad (187)$$

These values allow for the solution of the temperature at all points through the PF. Once each point in the (i, j) index is known, the values can be checked for convergence and then the calculations are iterated until an acceptable level of convergence is achieved, as described above.

In order to validate the model, a number of different tests were accomplished. The first test involved comparing the model to prior PF modelling approaches. Specifically, the model was compared to SiC DPF warm-up and cool down events with the cool down event including soot oxidation. After validation, the model was checked against the current simulation standards for a 2.2 L DPF. As a result, cerium oxidation was added to the model and a few tests were subsequently accomplished. Specifically, the model was validated against cerium-only oxidation tests followed by soot-only oxidation and then finally cerium and soot oxidation tests. After successful completion of these tests, then a 2.2 L GPF model was created and compared against the standard models for both active and passive regeneration events. Finally, the model was compared to data for a 1.7 L GPF in order to illustrate where the next step of advances can be made in the model development. In the following sections, the model validations are presented along with all of the simulation parameters.

To validate the DPF model, it is worthwhile to compare first its predictions to that of a more simplistic warm-up experiment for a SiC DPF. This ensures that the model is able to simulate appropriately the transient response of a PF in absence of chemical reactions. Moreover, this can help determine the number of axial zones that best match the temperature results in a one-dimensional adiabatic setting. However, instead of using the specified density of the SiC filter (1885 kg m$^{-3}$) similar to prior efforts the choice was made to calibrate the model using this parameter.

As a result, matching of the temperature between the simulation and experimental data happened using a least square difference (LSQ) analysis. This occurs by minimizing the LSQ using MATLAB's "fmincon" function to find the filter density value ($\rho_f$). This process was repeated while varying the number of axial zones ($z_a$) from 4 to 50. Moreover, in order to find the speed of the model, MATLAB's "timeit" function provided the run time information. The system specifications are shown below in Table 1.

TABLE 1

| System specifications | |
|---|---|
| CPU | Intel i7-6700K |
| RAM | 16.0 GB |
| OS | Windows 10 64 bit |

Figure 2:
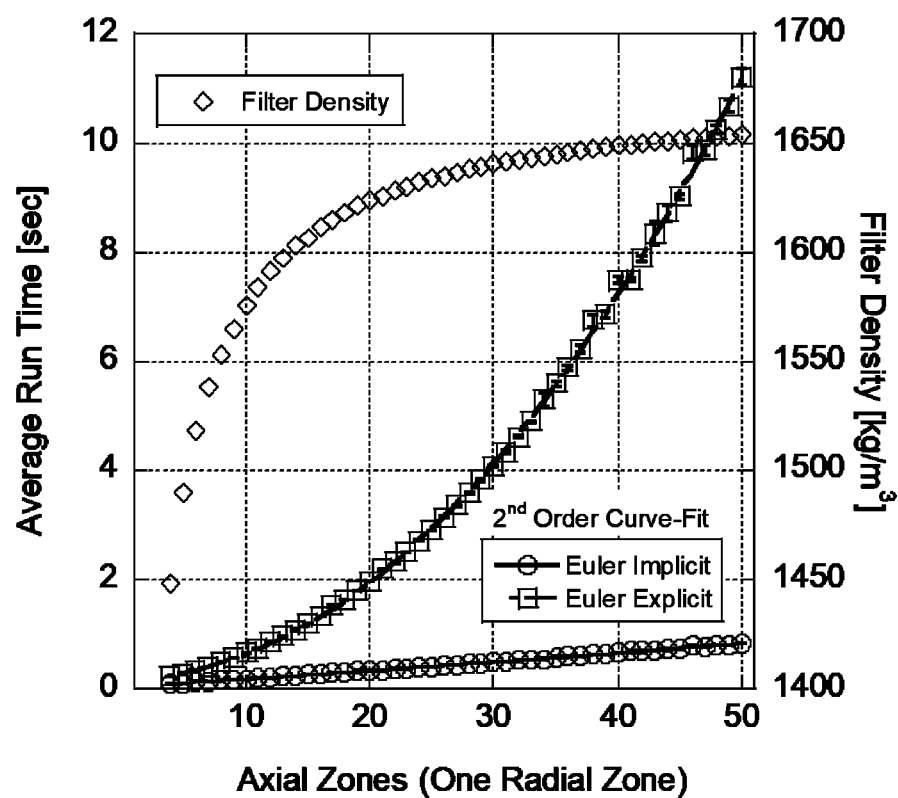
FIG. 2 is a graph of the average run time of the Euler Implicit and Euler Explicit temperature derivations as a function of the number of axial zones in accordance with aspects of the present disclosure.

Additionally, this time analysis included a comparison between Euler Implicit and Euler Explicit temperature derivation methodologies. The optimum number of axial zones was selected by convergence; that is to say when the $\rho_f$ value is within one percent of the corresponding value at $z_a=50$. However, in order to address stability issues with the Euler Explicit formulation required increasing the number of time steps for the temperature calculations. This resulted in the largely inflated average run times found for its derivation as seen in FIG. 2. The graph in FIG. 2 shows the average run time of the Euler Implicit and Euler Explicit temperature derivations as a function of the number of axial zones while the filter density was changed to minimize the temperature difference between the simulation and experiments for the Euler Implicit at each axial zone is shown in the graph, with standard deviation indicated as error bars. At 28 axial zones, the filter density is less than 1% different than the value at 50 axial zones (adiabatic simulation). Overall, the density values converge within 1% of the $z_a=50$ value when the number of axial zones is equal to or greater than 28. The operating parameters are shown below in Table. 2.

TABLE 2

| Warm-up all Inputs | |
|---|---|
| Pressure in [Pa] | 101500 |
| Specified GPF Geometric and Thermodynamic Parameters | |
| Cell Density [–] | 280000 |
| Cell Diameter [m] | 0.00146 |
| Wall Thickness [m] | 0.00043 |
| Total Filter Length [m] | 0.1524 |
| Total Filter Diameter [m] | 0.144 |
| Filter Density [kg/m$^3$] | 1637.962 |
| Corderite Filter Thermal Conductivity [W/(m*k)] | 15 |
| Filter Specific Heat [J/(kg*K)] | 1025 |
| Particulate Density [kg/m$^3$] | 75 |
| Particulate Thermal Conductivity [W/(m*K)] | 2 |
| Particulate Specific Heat [J/(kg*k)] | 889 |
| Other thermodynamic parameters | |
| Viscosity of Air [Pa*s] | 2.50E−05 |
| Gas Thermal Conductivity [W/(m*K)] | 0.04 |
| Gas Constant Pressure Specific Heat [J/(kg*K)] | 1010 |
| Universal Gas constant [J/(kmol*K)] | 8314.4621 |
| Sherwood number [–] | 3 |
| Nusselt number [–] | 3 |
| Ambient Heat transfer Parameters | |
| Convective Heat Transfer [W/(m$^2$*K)] | 59.212162 |
| Ambient Temperature [K.] | 300 |
| GPF Outer Shell Emissivity [–] | 0 |
| Stephan-Boltzmann Constant W/(m$^2$*K$^4$)] | 5.67E−08 |

TABLE 2-continued

Kinetic Parameters

| | |
|---|---|
| Reaction order | 1 |
| Soot Specific Surface Area [m$^{-1}$] | 5.50E+07 |
| Pre-exponential A1 | 1.00E+00 |
| Pre-exponential A2 | 1.00E+00 |
| Pre-exponential A3 | 1.00E+00 |
| Pre-exponential A4 | 1.00E+00 |
| Activation Energy E1 [kJ/mol] | 2.05E+02 |
| Activation Energy E2 [kJ/mol] | 2.05E+02 |
| Activation Energy E3 [kJ/mol] | 5.50E+01 |
| Activation Energy E4 [kJ/mol] | 5.50E+01 |

Heat of Reaction

| | |
|---|---|
| Heat of CO reaction [kJ/mol] | 1.11E+02 |
| Heat of CO$_2$ reaction [kJ/mol] | 3.94E+02 |
| CO Heat of Reaction Calibration | 1.75 |
| CO$_2$ Heat of Reaction Calibration | 1.75 |

Cerium Reaction Information

| | |
|---|---|
| Initial Ce$_2$O$_3$ fraction throughout the PF | 0 |
| Cerium Storage Capacity [mol/m$^3$] | 1.16E+02 |
| Cerium Pre-exponential [1/(Pa$^{0.5}$*s)] | 3.25E+02 |
| Cerium Activation Energy [kJ/mol] | 1.50E+02 |
| Heat of Cerium Reaction [J/mol] | −178700 |

Modeling Parameters

| | |
|---|---|
| Number of Axial Zones [−] | 28 |
| Number of Radial Zones [−] | 8 |

Input Data

| | |
|---|---|
| Volumetric Flow Rate [L*min$^{-1}$] | 1500 |
| Mass Flow Rate [kg s$^{-1}$] | 0.0296 |
| Deposit Loading [g] | 37.11 |

Figure 3:
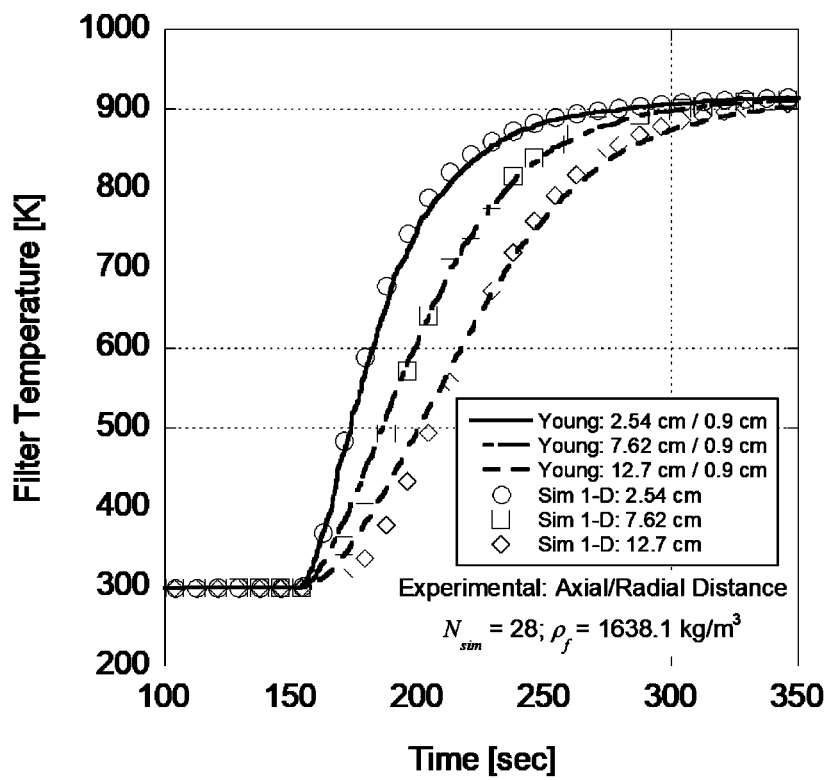
FIG. 3 is a graph of the optimized results in comparison to warm-up experiments using only one radial node in accordance with aspects of the present disclosure.

FIG. 3 shows a graph of the filter temperature of the Euler Implicit and Euler Explicit temperature derivations as a function of the time. The number of axial zones was set equal to 28, there was one radial zone, and the density of the filter was optimized to minimize the difference between the experimental temperature profile and the simulated profile (adiabatic simulation). The one radial zone model's temperature profile shows a strong correlation with the experimental results, having an R$^2$ value of 0.9968.

Warm-Up SiC DPF—Multiple Radial Zones

Figure 4:
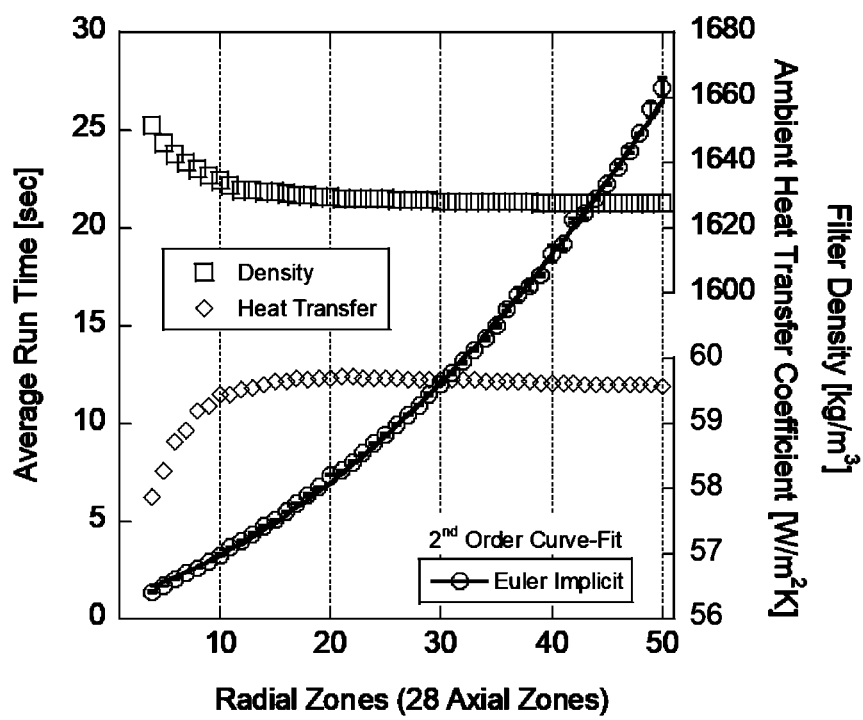
FIG. 4 is a graph of the average run time (standard deviation indicated as error bars) of the Euler Implicit temperature derivations as a function of radial zones (28 axial zones) with the optimized filter density and heat transfer indicated on the second y-axis in accordance with aspects of the present disclosure.

After finding the number of axial zones that should be used in the model, radial zones can be added to the model. The number of radial zones ($z_r$) necessary can found in a similar manner to that which was used for axial zones. The number of axial zones is set to 28 and then the number of radial zones is iterated from 4 to 50. The first step of the radial analysis is to minimize the LSQ difference for the temperature data by changing the filter density ($\rho_f$) and the ambient heat transfer coefficient ($h_{amb}$). The graph in FIG. 4 plots the average run time (standard deviation is indicated as error bars) of the Euler Implicit temperature derivations as a function of the number of radial zones while the filter density and ambient heat transfer were changed to minimize the temperature difference between the simulation and experiments. At 8 radial zones, the filter density is less than 1% than the value at 50 radial zones. In the radial analysis shown in FIG. 4, both the ambient heat transfer coefficient and the filter density converge to within 1% of their $z_r$=50 values at $z_r$=8. In all cases the run time is faster than real-time. Even for the most extreme case of 28 axial zones and 50 radial zones, the model was able to simulate the 250 seconds of data in approximately 27 seconds.

Figure 5:
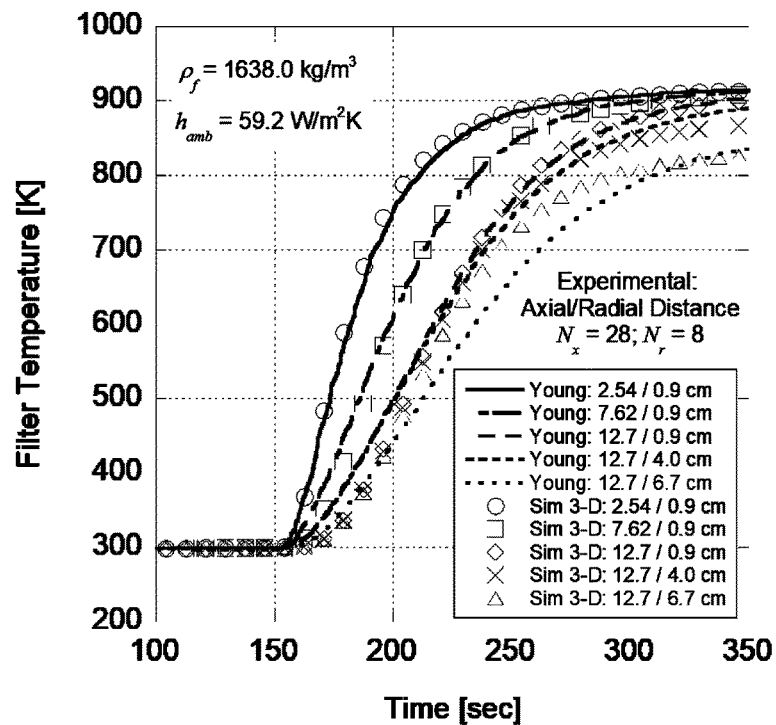
FIG. 5 is a graph of the optimized results in comparison to the warm-up experiments in three-dimensions in accordance with aspects of the present disclosure.

The graph in FIG. 5 shows the filter temperature of the Euler Implicit temperature derivations as a function of time. In FIG. 5, the number of axial zones was set equal to 28 and there were 8 radial zones. The density of the filter and the ambient heat transfer coefficient were optimized to minimize the difference between the experimental temperature profile and the simulated profile. The temperature profiles generated by the GPF model in both the one-dimensional and three-dimensional versions are shown in FIGS. 3 and 5, respectively. The model may be used to recreate heat-up data with an R$^2$ value of 0.994753, which represents a strong correlation between the two.

Exemplary parameters that may be utilized for oxidation calculations are shown below in Table 3.

TABLE 3

Oxidation all Inputs

| | |
|---|---|
| Pressure in [Pa] | 101500 |

Specified GPF Geometric and Thermodynamic Parameters

| | |
|---|---|
| Cell Density [−] | 280000 |
| Cell Diameter [m] | 0.00146 |
| Wall Thickness [m] | 0.00043 |
| Total Filter Length [m] | 0.1524 |
| Total Filter Diameter [m] | 0.144 |
| Filter Density [kg/m$^3$] | opt |
| Silicon Carbide Filter Thermal Conductivity [W/(m*k)] | 15 |
| Filter Specific Heat [J/(kg*K)] | 1025 |
| Particulate Density [kg/m$^3$] | 75 |
| Particulate Thermal Conductivity [W/(m*K)] | 2 |
| Particulate Specific Heat [J/(kg*k)] | 889 |

Other Thermodynamic Parameters

| | |
|---|---|
| Viscosity of Air [Pa*s] | 2.50E−05 |
| Gas Thermal Conductivity [W/(m*K)] | 0.04 |
| Gas Constant Pressure Specific Heat [J/(kg*K)] | 1010 |
| Universal Gas constant [J/(kmol*K)] | 8314.4621 |
| Sherwood number [−] | 3 |
| Nusselt number [−] | 3 |

Ambient Heat transfer parameters

| | |
|---|---|
| Convective Heat Transfer [W/(m$^2$*K)] | opt |
| Ambient Temperature [K.] | 300 |
| GPF Outer Shell Emissivity [−] | 0 |
| Stephan-Boltzmann Constant [W/(m$^2$*K$^4$)] | 5.67E−08 |

Kinetic Parameters

| | |
|---|---|
| Reaction order | 1 |
| Soot Specific Surface Area [m$^{-1}$] | 5.50E+07 |
| Pre-exponential A1 | 1.22E+02 |
| Pre-exponential A2 | 5.24E+01 |
| Pre-exponential A3 | 2.62E−04 |
| Pre-exponential A4 | 1.31E−04 |
| Activation Energy E1 [kJ/mol] | 1.55E+02 |
| Activation Energy E2 [kJ/mol] | 1.55E+02 |
| Activation Energy E3 [kJ/mol] | 6.40E+01 |
| Activation Energy E4 [kJ/mol] | 6.40E+01 |

Heat of Reaction

| | |
|---|---|
| Heat of CO reaction [kJ/mol] | 1.11E+02 |
| Heat of CO$_2$ reaction [kJ/mol] | 3.94E+02 |
| CO Heat of Reaction Calibration | 5.00E−01 |
| CO$_2$ Heat of Reaction Calibration | 5.00E−01 |

TABLE 3-continued

| Cerium Reaction Information | |
|---|---|
| Initial $Ce_2O_3$ fraction throughout the PF | 0.00E+00 |
| Cerium Storage Capacity [mol/m$^3$] | 1.16E+02 |
| Cerium Pre-exponential [1/(Pa$^{0.5}$*s)] | 3.25E+02 |
| Cerium Activation Energy [kJ/mol] | 1.50E+02 |
| Heat of Cerium Reaction [J/mol] | −178700 |

| Modeling Parameters | |
|---|---|
| Number of Axial Zones [−] | 28 |
| Number of Radial Zones [−] | 8 |

| Input Data | |
|---|---|
| Volumetric Flow Rate [L*min$^{−1}$] | 700 |
| Mass Flow Rate [kg s$^{−1}$] | 0.0138 |
| Inlet $O_2$ after 40 seconds | 18% |

Figure 6:
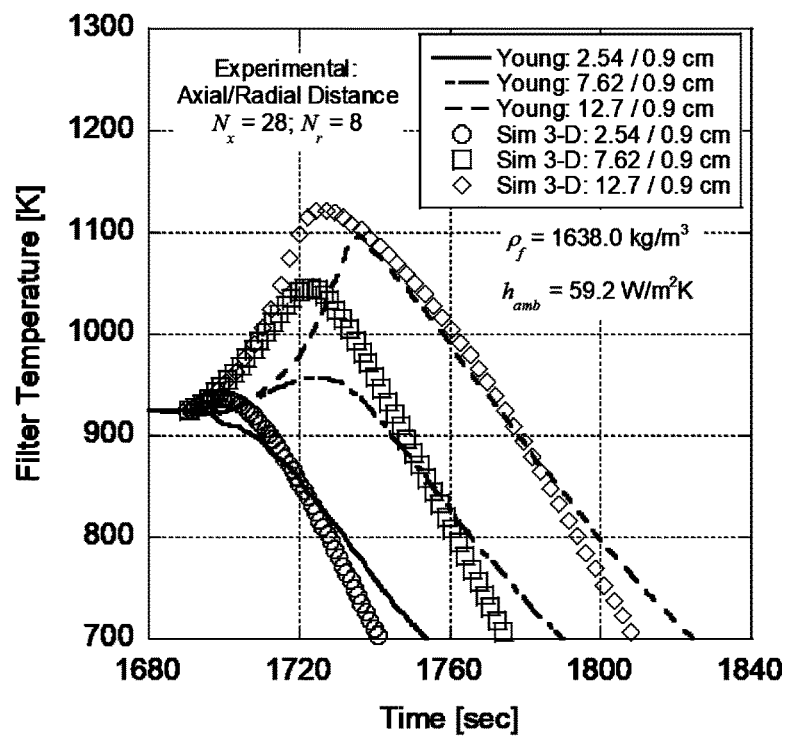
FIG. 6 is a graph of the filter temperature for the Euler Implicit temperature derivations matching the 55% PM conversion amount during the cool down and oxidation experiment in accordance with aspects of the present disclosure.
Figure 7A:
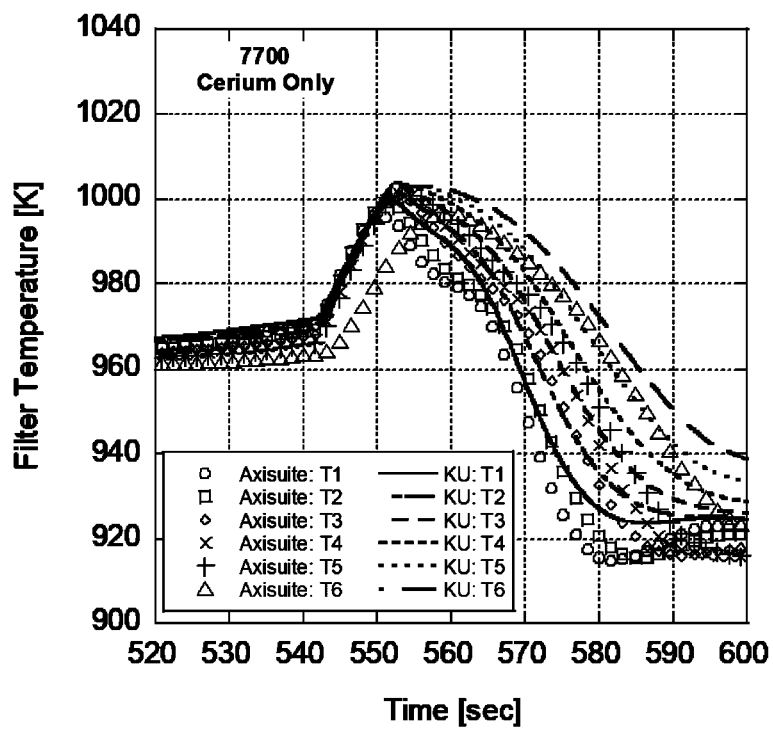
FIG. 7A shows a graph of filter temperatures of the Euler Implicit temperature derivations in comparison to a commercial model for cerium only simulations.
Figure 7B:
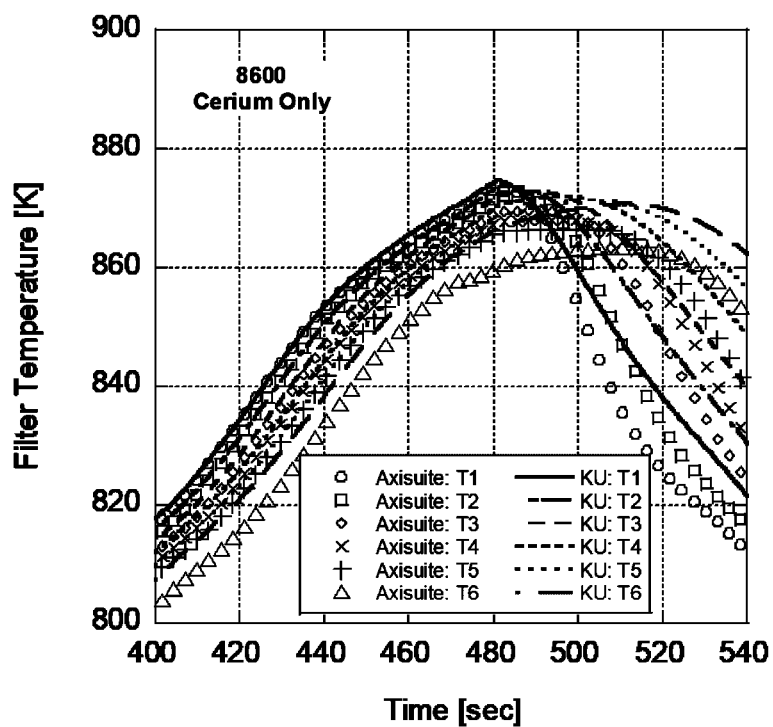
FIG. 7B shows a graph of filter temperatures of the Euler Implicit temperature derivations in comparison to a commercial model for cerium only simulations.
Figure 7C:
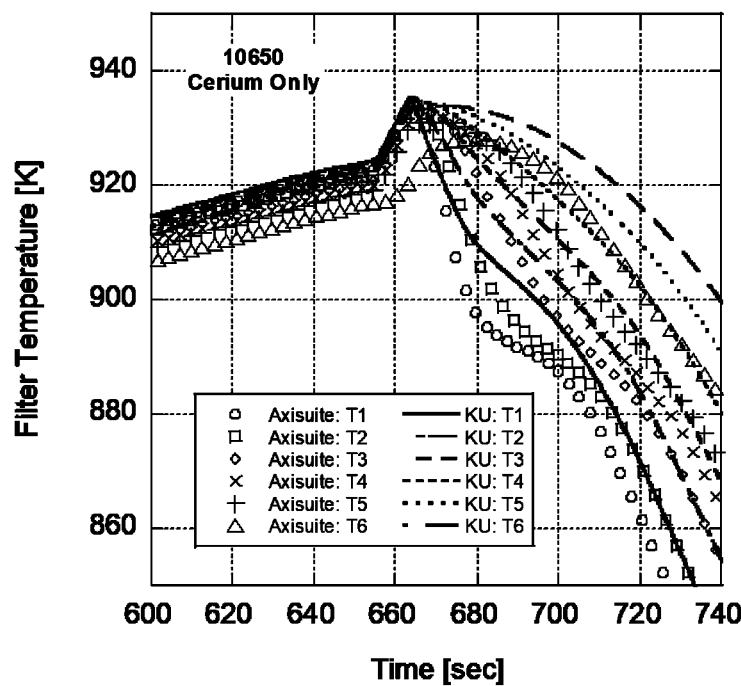
FIG. 7C shows a graph of filter temperatures of the Euler Implicit temperature derivations in comparison to a commercial model for cerium only simulations.
Figure 7D:
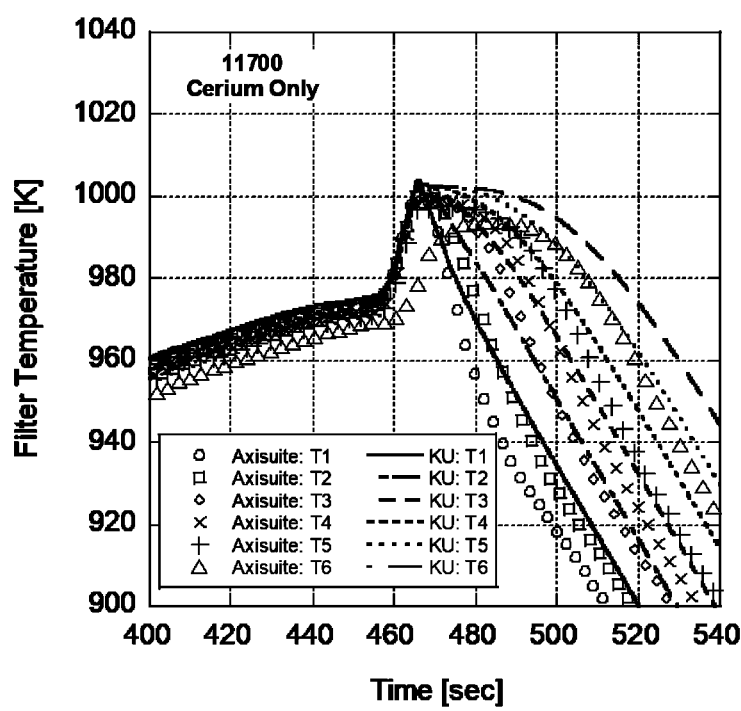
FIG. 7D shows a graph of filter temperatures of the Euler Implicit temperature derivations in comparison to a commercial model for cerium only simulations.
Figure 7E:
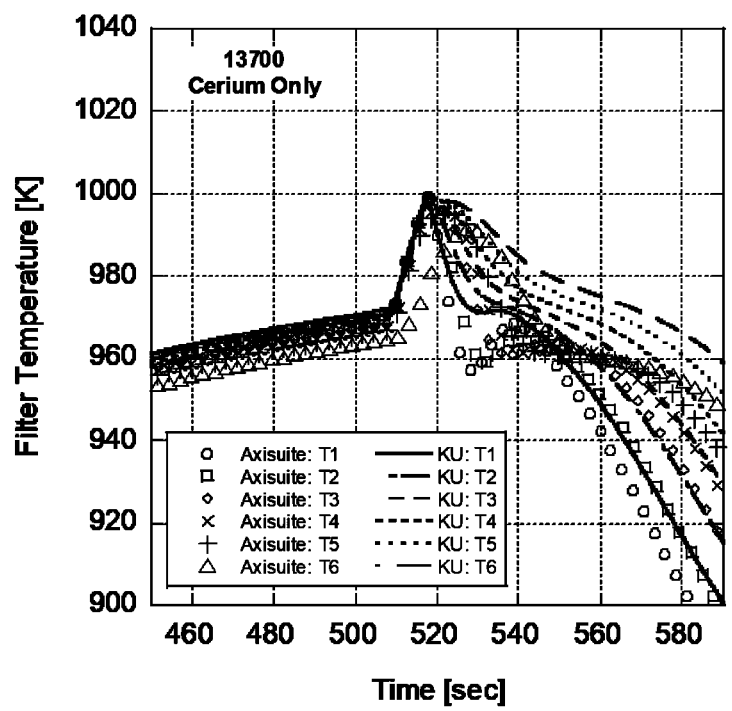
FIG. 7E shows a graph of filter temperatures of the Euler Implicit temperature derivations in comparison to a commercial model for cerium only simulations.
Figure 7F:
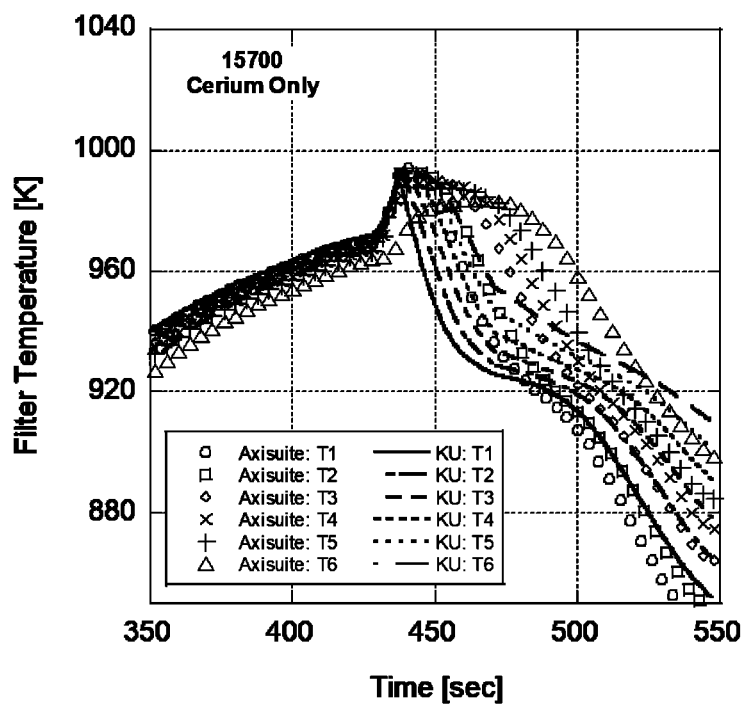
FIG. 7F shows a graph of filter temperatures of the Euler Implicit temperature derivations in comparison to a commercial model for cerium only simulations.
Figure 7G:
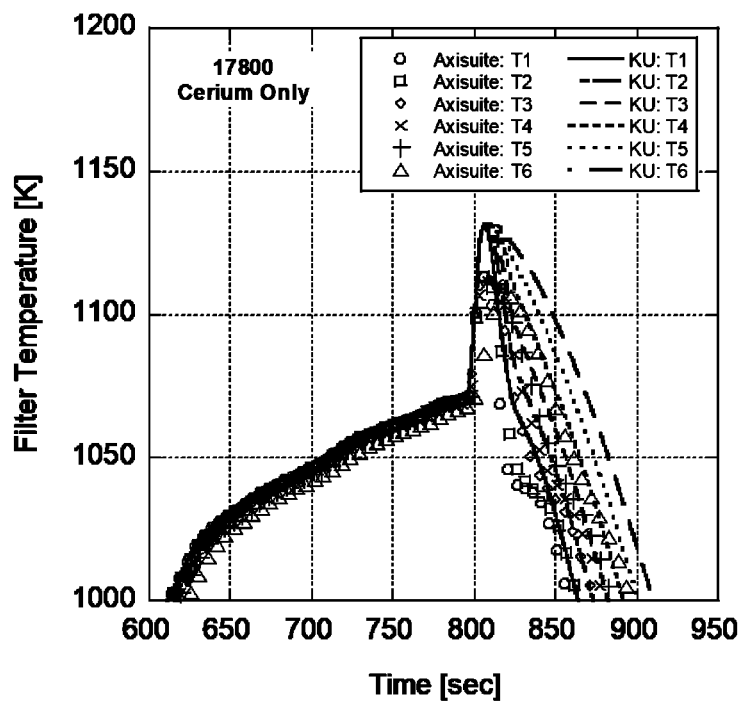
FIG. 7G shows a graph of filter temperatures of the Euler Implicit temperature derivations in comparison to a commercial model for cerium only simulations.

The graph in FIG. 6 shows the filter temperature of the Euler Implicit temperature derivations as a function of the time. In FIG. 6, the number of axial zones was set equal to 28 and there were 8 radial zones. The density of the filter and the ambient heat transfer coefficient were set based on the prior radial experiments. The Axisuite kinetic parameters were employed and a single calibration constant was used to achieve a 55% conversion efficiency. In this example, the reaction heats were reduced by ½ in order to match the temperature profiles.

When modeling the oxidation results it was found that the PF model tends toward lighting off earlier than the experimental work. Despite this, the temperature data still has a strong correlation with the experimental oxidation data. The 2.54 cm temperature data has the strongest correlation with an $R^2$ value of 0.9946; although it may still over predict the peak temperature. The 7.62 cm data also has a quite strong correlation with an $R^2$ value of 0.9916 despite the light off difference. Finally, the 12.7 cm data had the weakest correlation with an $R^2$ value of 0.9561. Further investigation of the premature light off found in the oxidation simulation may be needed. At 28 axial nodes and 8 radial nodes, the model takes 1.250+/−0.012 seconds to run, which is 160× faster than real-time.

Operating parameters for calculations involving Cerium reactions are shown below in Table 4. This is checking the cerium oxidation inclusion, no soot oxidation.

TABLE 4

| Cerium Addition Inputs | |
|---|---|
| Pressure in [Pa] | 101500 |

| Specified GPF Geometric and Thermodynamic Parameters | |
|---|---|
| Cell Density [−] | 465000 |
| Cell Diameter [m] | 0.001251 |
| Wall Thickness [m] | 0.000216 |
| Total Filter Length [m] | 0.163 |
| Total Filter Diameter [m] | 0.1321 |
| Filter Density [kg/m$^3$] | 1060.4 |
| Corderite Filter Thermal Conductivity [W/(m*k)] | 1.08625 |
| Filter Specific Heat [J/(kg*K)] | 1182 |
| Particulate Density [kg/m$^3$] | 60 |
| Particulate Thermal Conductivity [W/(m*K)] | 2 |
| Particulate Specific Heat [J/(kg*k)] | 1500 |

TABLE 4-continued

| Other Thermodynamic Parameters | |
|---|---|
| Viscosity of Air [Pa*s] | 2.50E−05 |
| Gas Thermal Conductivity [W/(m*K)] | 0.04 |
| Gas Constant Pressure Specific Heat [J/(kg*K)] | 1010 |
| Universal Gas constant [J/(kmol*K)] | 8314.4621 |
| Sherwood number [−] | 3 |
| Nusselt number [−] | 3 |

| Ambient Heat Transfer Parameters | |
|---|---|
| Convective Heat Transfer [W/(m$^2$*K)] | 0 |
| Ambient Temperature [K.] | 300 |
| GPF Outer Shell Emissivity [−] | 0 |
| Stephan-Boltzmann Constant [W/(m$^2$*K$^{−1}$)] | 5.67E−08 |

| Kinetic Parameters | |
|---|---|
| Reaction order | 1 |
| Soot Specific Surface Area [m$^{−1}$] | 5.50E+07 |
| Pre-exponential A1 | 3.57E+01 |
| Pre-exponential A2 | 1.53E+01 |
| Pre-exponential A3 | 7.65E−05 |
| Pre-exponential A4 | 3.83E−05 |
| Activation Energy E1 [kJ/mol] | 1.55E+02 |
| Activation Energy E2 [kJ/mol] | 1.55E+02 |
| Activation Energy E3 [kJ/mol] | 6.40E+01 |
| Activation Energy E4 [kJ/mol] | 6.40E+01 |

| Heat of Reaction | |
|---|---|
| Heat of CO reaction [kJ/mol] | 1.11E+02 |
| Heat of $CO_2$ reaction [kJ/mol] | 3.94E+02 |
| CO Heat of Reaction Calibration | 0.00E+00 |
| $CO_2$ Hea tof Reaction Calibration | 0.00E+00 |

| Cerium Reaction Information | |
|---|---|
| Initial $Ce_2O_3$ fraction throughout the PF | 1.00E+00 |
| Cerium Storage Capacity [mol/m$^3$] | 1.16E+02 |
| Cerium Pre-exponential [1/[1/(Pa$^{0.5}$*s)] | 3.25E+02 |
| Cerium Activation Energy [kJ/mol] | 1.50E+02 |
| Heat of Cerium Reaction [J/mol] | −178700 |

| Modeling Parameters | |
|---|---|
| Number of Axial Zones [−] | 12 |
| Number of Radial Zones [−] | 1 |

FIGS. 7A-7G show graphs of filter temperatures of the Euler Implicit and Euler Explicit temperature derivations as a function of the time. For the 17800 case, the model took 10.353+/−0.125 seconds to run; 97× faster than real-time.

Soot Addition—Comparison with Axisuite

Operating parameters for calculations involving soot addition are shown below in Table 5. This is checking the soot oxidation inclusion, no cerium oxidation.

TABLE 5

| Soot Addition All Inputs | |
|---|---|
| Pressure in [Pa] | 101500 |

| Specified GPF Geometric and Thermodynamic Parameters | |
|---|---|
| Cell Density [−] | 465000 |
| Cell Diameter [m] | 0.001251 |
| Wall Thickness [m] | 0.000216 |
| Total Filter Length [m] | 0.163 |
| Total Filter Diameter [m] | 0.1321 |
| Filter Density [kg/m$^3$] | 1060.4 |
| Corderite Filter Thermal Conductivity [W/(m*k)] | 1.08625 |
| Filter Specific Heat [J/(kg*K)] | 1182 |

TABLE 5-continued

| | |
|---|---|
| Particulate Density [kg/m$^3$] | 60 |
| Particulate Thermal Conductivity [W/(m*K)] | 2 |
| Particulate Specific Heat [J/(kg*k)] | 1500 |
| *Other Thermodynamic Parameters* | |
| Viscosity of Air [Pa*s] | 2.50E−05 |
| Gas Thermal Conductivity [W/(m*K)] | 0.04 |
| Gas Constant Pressure Specific Heat [J/(kg*K)] | 1010 |
| Universal Gas constant [J/(kmol*K)] | 8314.4621 |
| Sherwood number [−] | 3 |
| Nusselt number [−] | 3 |
| *Ambient Heat transfer Parameters* | |
| Convective Heat Transfer [W/(m$^2$*K)] | 0 |
| Ambient Temperature [K.] | 300 |
| GPF Outer Shell Emissivity [−] | 0 |
| Stephan-Boltzmann Constant [W/(m$^2$K$^4$)] | 5.67E−08 |
| *Kinetic Parameters* | |
| Reaction order | 1 |
| Soot Specific Surface Area [m$^{-1}$] | 5.50E+07 |
| Pre-exponential A1 | 3.57E+01 |
| Pre-exponential A2 | 1.53E+01 |
| Pre-exponential A3 | 7.65E−05 |
| Pre-exponential A4 | 3.83E−05 |
| Activation Energy E1 [kJ/mol] | 1.55E+02 |
| Activation Energy E2 [kJ/mol] | 1.55E+02 |
| Activation Energy E3 [kJ/mol] | 6.40E+01 |
| Activation Energy E4 [kJ/mol] | 6.40E+01 |
| *Heat of Reaction* | |
| Heat of CO reaction [kJ/mol] | 1.11E+02 |
| Heat of CO$_2$ reaction [kJ/mol] | 3.94E+02 |
| CO Heat of Reaction Calibration | 2.00E+00 |
| CO$_2$ Heat of Reaction Calibration | 2.00E+00 |
| *Cerium Reaction Information* | |
| Initial Ce$_2$O$_3$ fraction throughout the PF | 1.08E−05 |
| Cerium Storage Capacity [mol/m$^3$] | 1.16E+02 |
| Cerium Pre-exponential [1/(Pa$^{0.5}$*s)] | 3.25E+02 |
| Cerium Activation Energy [kJ/mol] | 1.50E+02 |
| Heat of Cerium Reaction [J/mol] | −178700 |
| *Modeling Parameters* | |
| Number of Axial Zones [−] | 12 |
| Number of Radial Zones [−] | 1 |

Figure 8A:
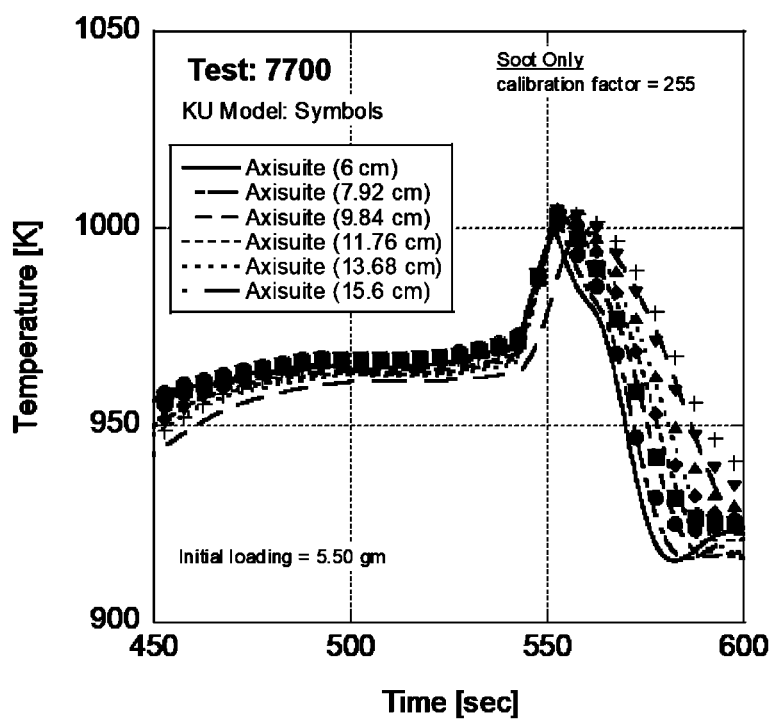
FIG. 8A shows a graph of the filter temperatures of the Euler Implicit temperature derivations in comparison to a commercial model for soot oxidation only simulations.
Figure 8B:
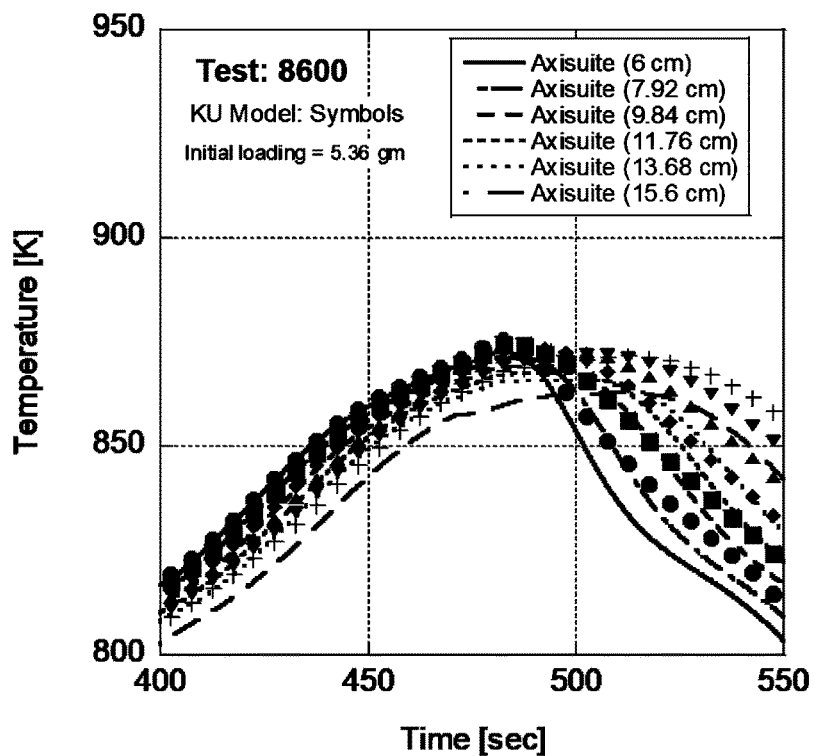
FIG. 8B shows a graph of the filter temperatures of the Euler Implicit temperature derivations in comparison to a commercial model for soot oxidation only simulations.
Figure 8C:
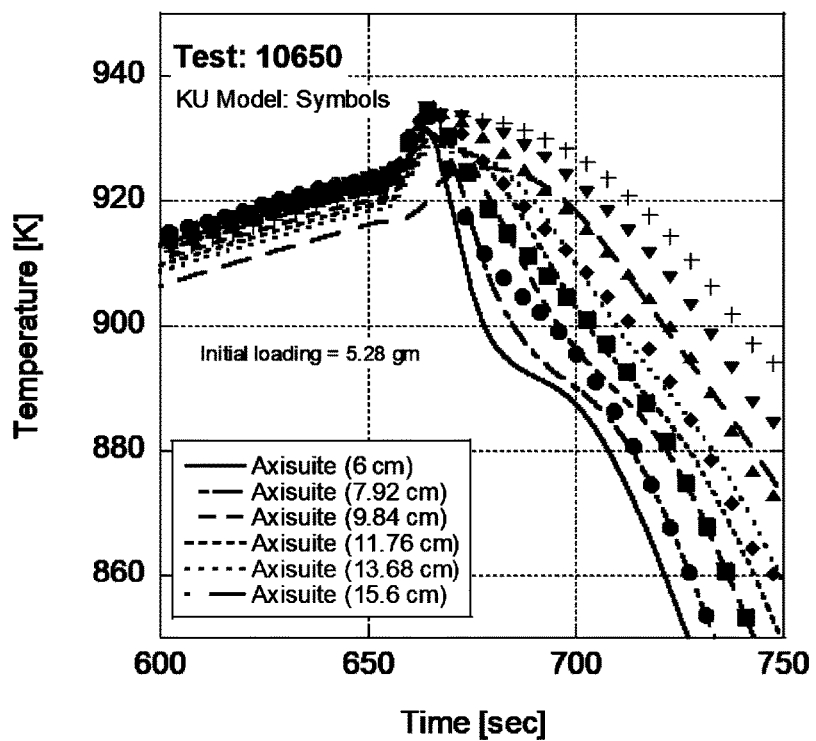
FIG. 8C shows a graph of the filter temperatures of the Euler Implicit temperature derivations in comparison to a commercial model for soot oxidation only simulations.
Figure 8D:
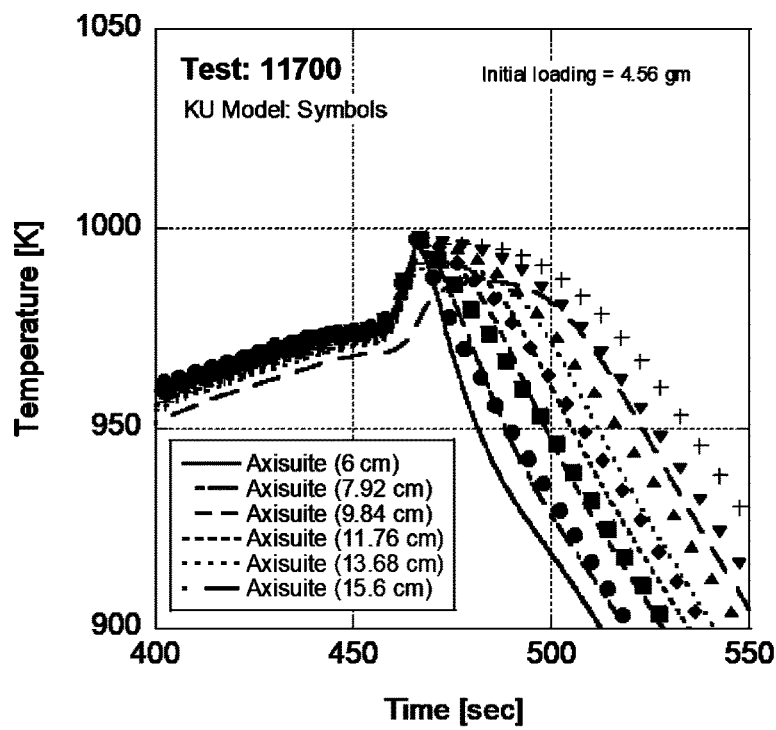
FIG. 8D shows a graph of the filter temperatures of the Euler Implicit temperature derivations in comparison to a commercial model for soot oxidation only simulations.
Figure 8E:
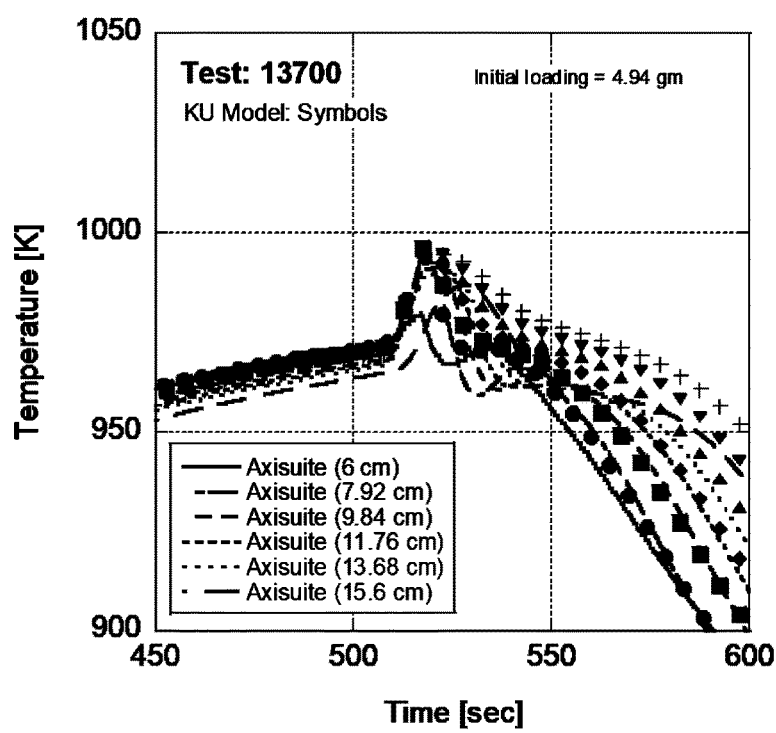
FIG. 8E shows a graph of the filter temperatures of the Euler Implicit temperature derivations in comparison to a commercial model for soot oxidation only simulations.
Figure 8F:
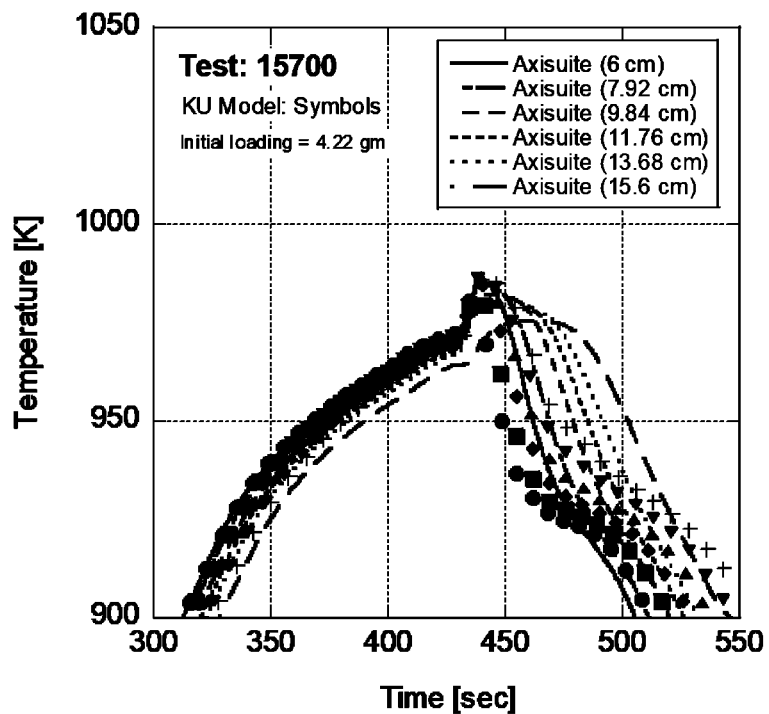
FIG. 8F shows a graph of the filter temperatures of the Euler Implicit temperature derivations in comparison to a commercial model for soot oxidation only simulations.
Figure 8G:
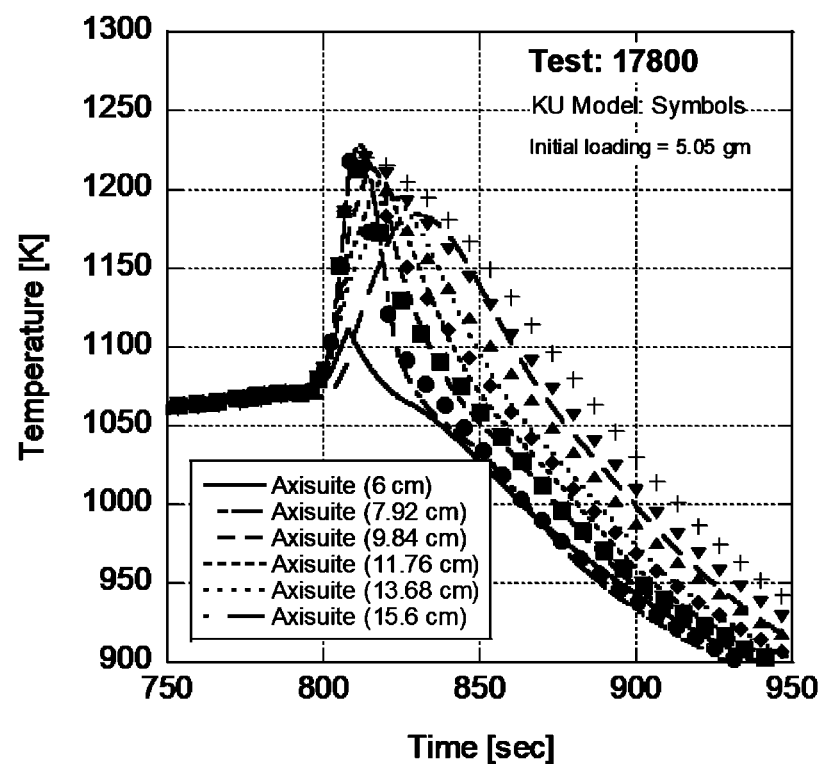
FIG. 8G shows a graph of the filter temperatures of the Euler Implicit temperature derivations in comparison to a commercial model for soot oxidation only simulations.
Figure 8H:
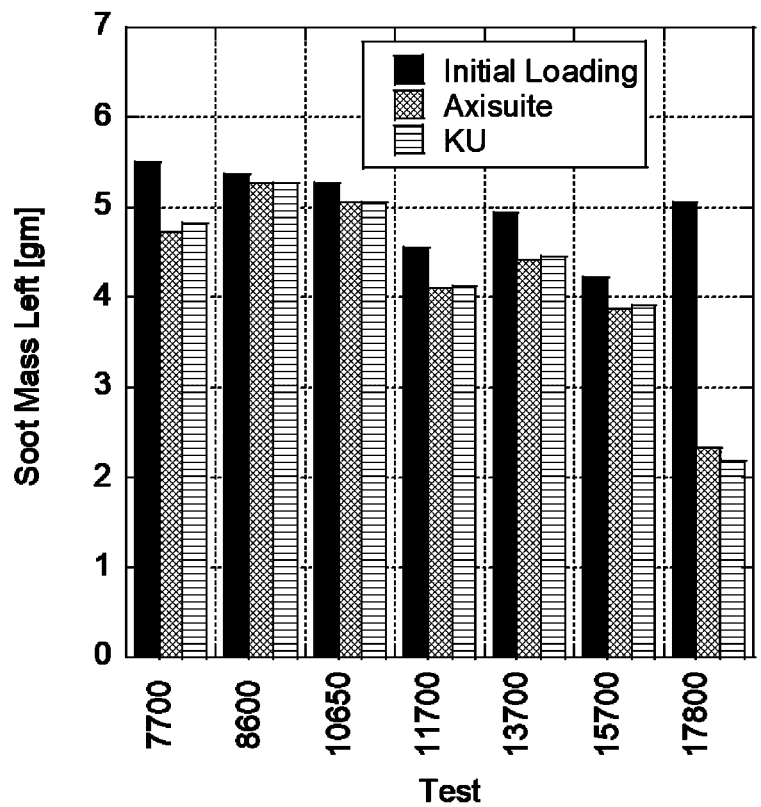
FIG. 8H shows a graph of the comparison of the soot mass left to a commercial model for soot oxidation only simulations.
Figure 9A:
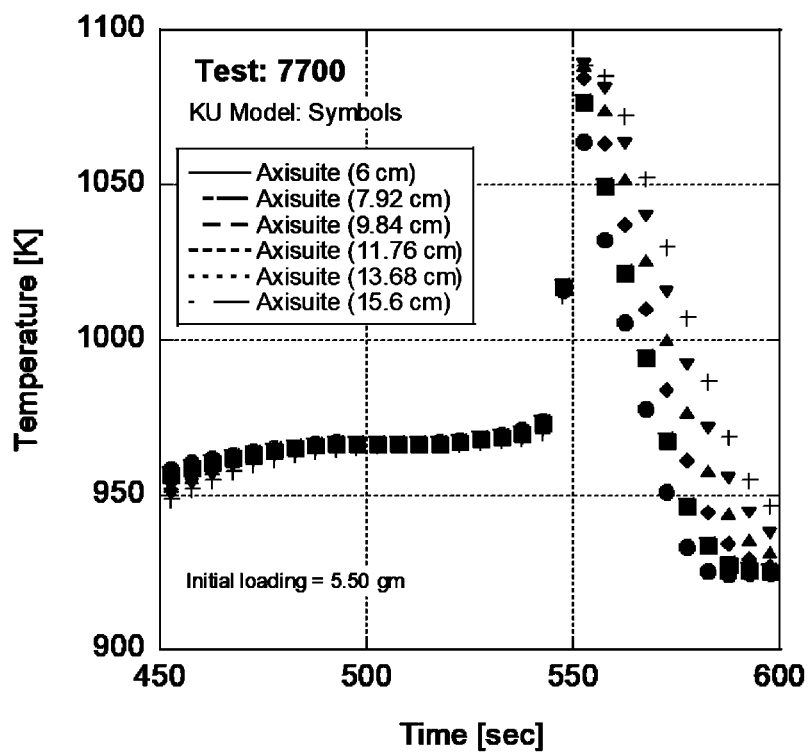
FIG. 9A shows a graph of the filter temperatures of the Euler Implicit temperature derivations in comparison to a commercial model for cerium and soot oxidation simulations.
Figure 9B:
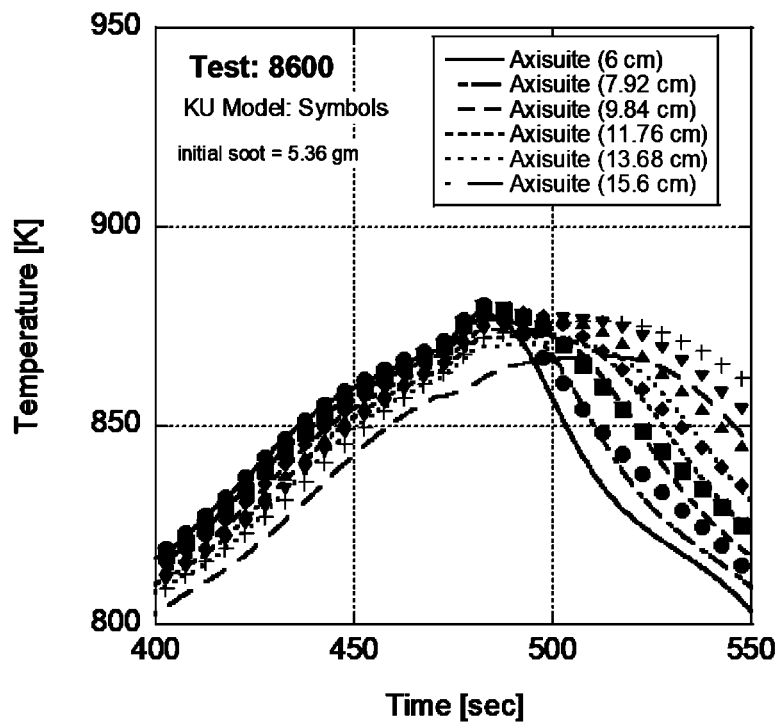
FIG. 9B shows a graph of the filter temperatures of the Euler Implicit temperature derivations in comparison to a commercial model for cerium and soot oxidation simulations.
Figure 9C:
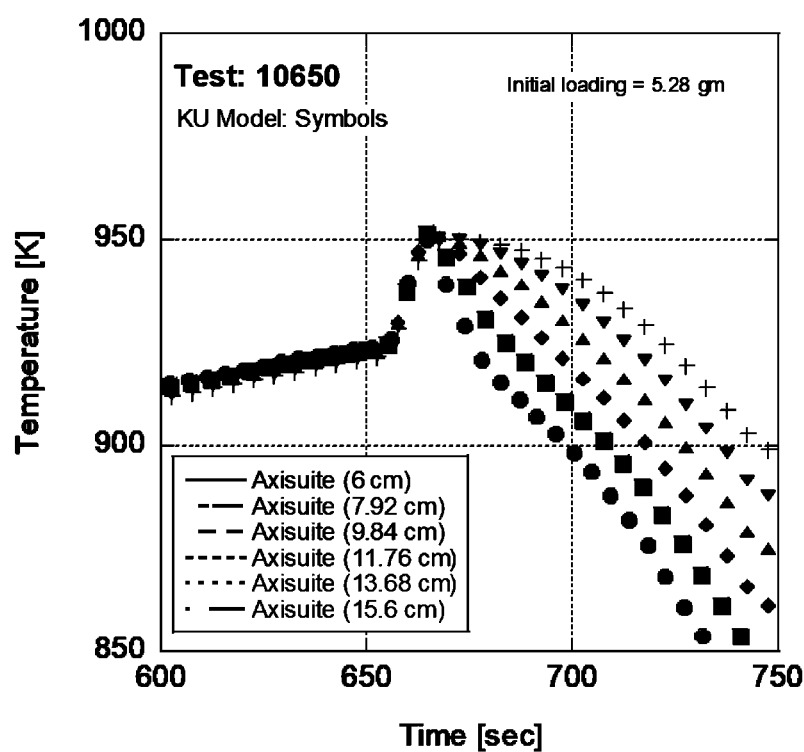
FIG. 9C shows a graph of the filter temperatures of the Euler Implicit temperature derivations in comparison to a commercial model for cerium and soot oxidation simulations.
Figure 9D:
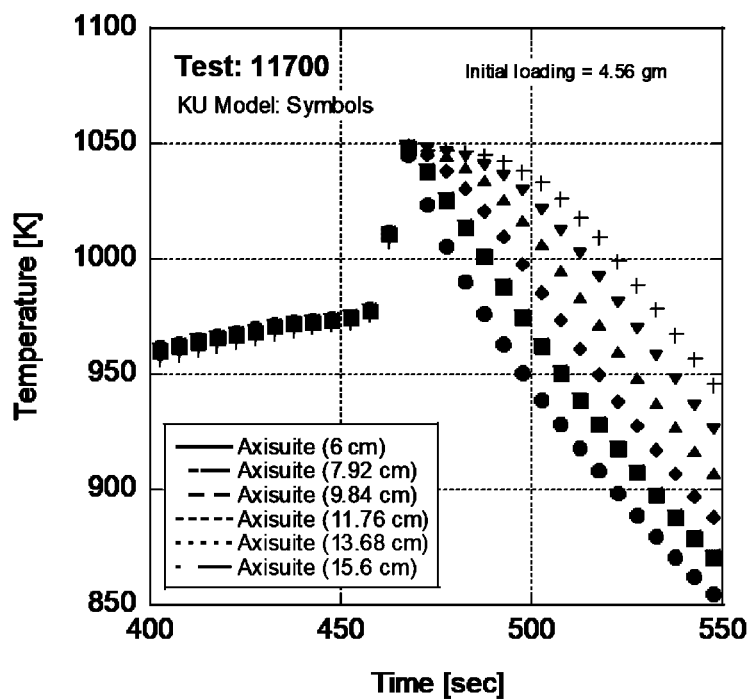
FIG. 9D shows a graph of the filter temperatures of the Euler Implicit temperature derivations in comparison to a commercial model for cerium and soot oxidation simulations.
Figure 9E:
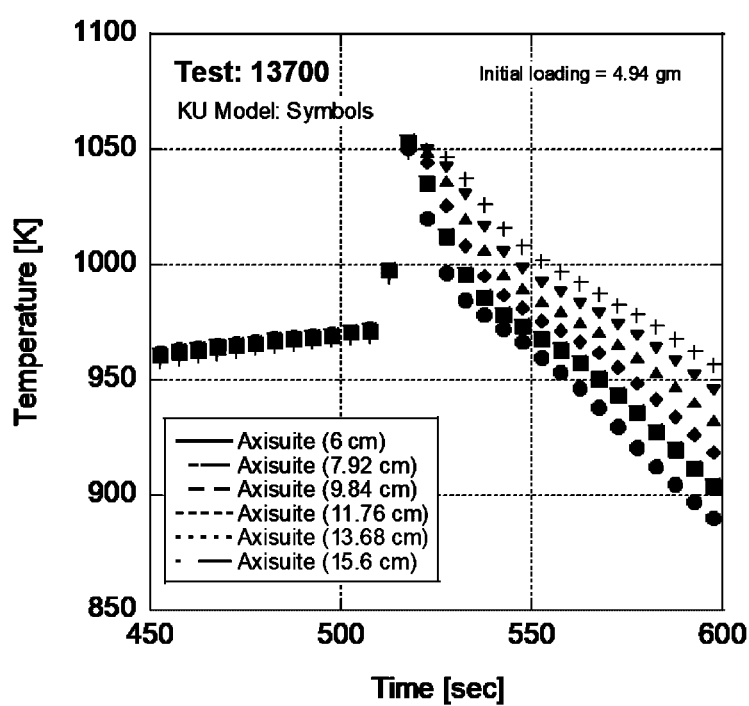
FIG. 9E shows a graph of the filter temperatures of the Euler Implicit temperature derivations in comparison to a commercial model for cerium and soot oxidation simulations.
Figure 9F:
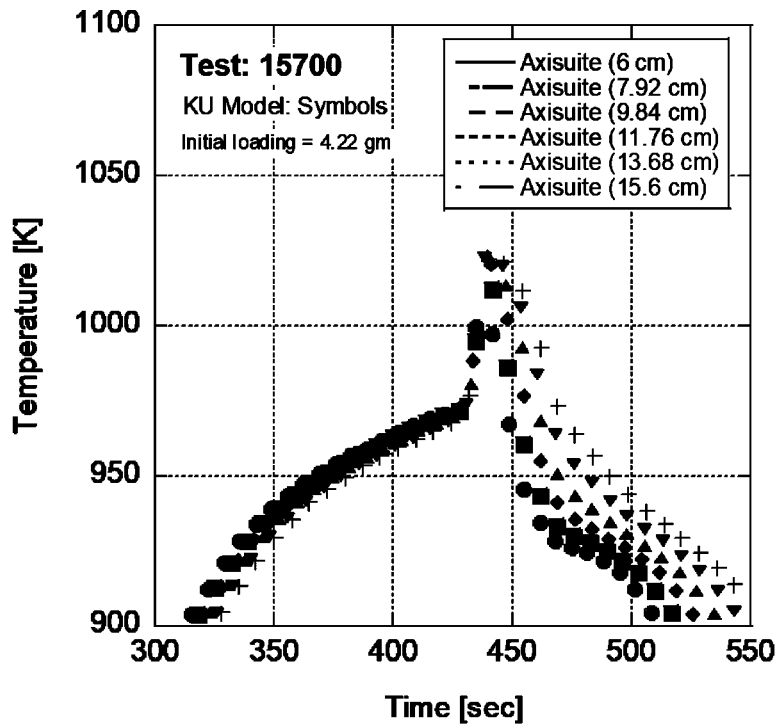
FIG. 9F shows a graph of the filter temperatures of the Euler Implicit temperature derivations in comparison to a commercial model for cerium and soot oxidation simulations.
Figure 9G:
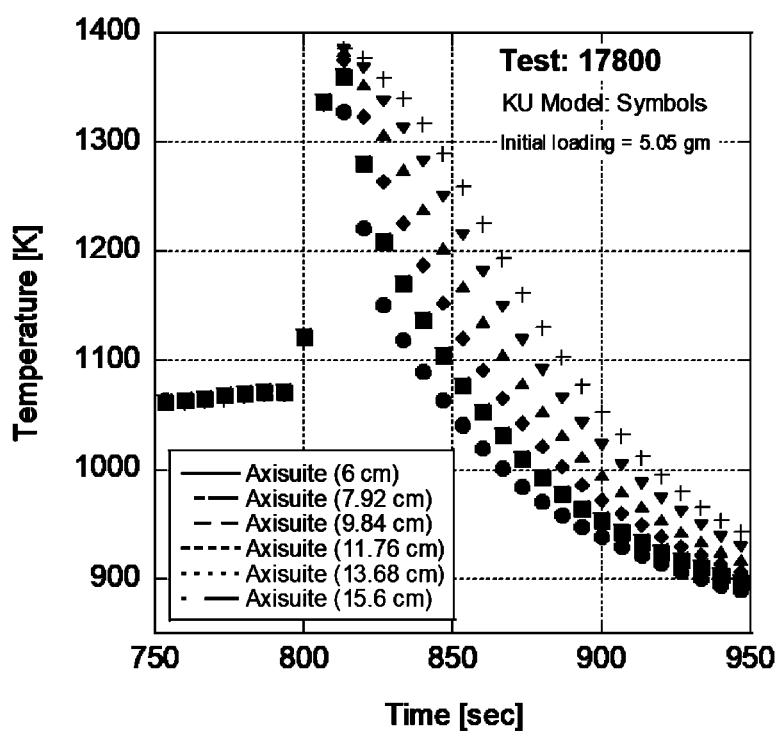
FIG. 9G shows a graph of the filter temperatures of the Euler Implicit temperature derivations in comparison to a commercial model for cerium and soot oxidation simulations.
Figure 9H:
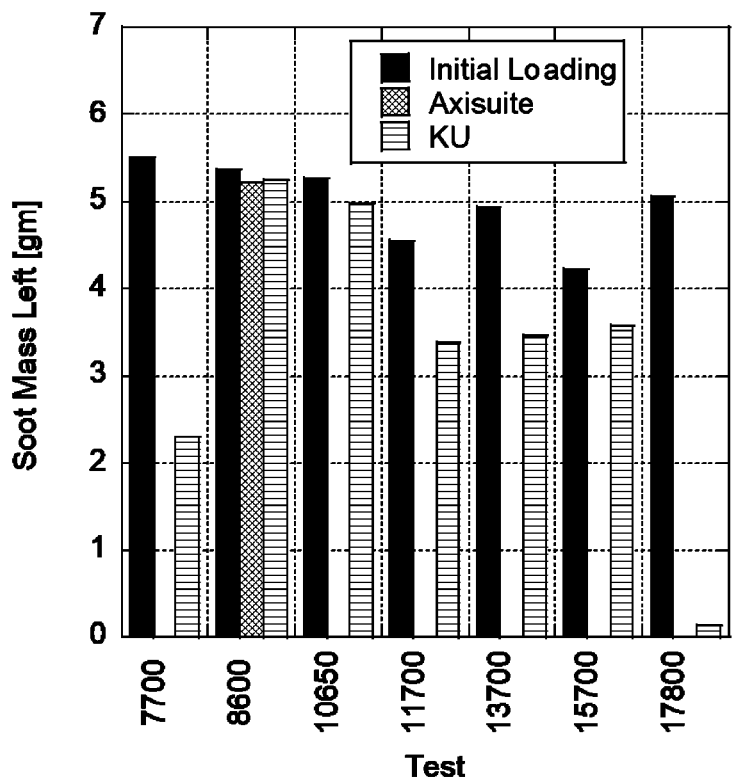
FIG. 9H shows a graph of the comparison of the soot mass left to a commercial model for cerium and soot oxidation simulations.
Figure 10A:
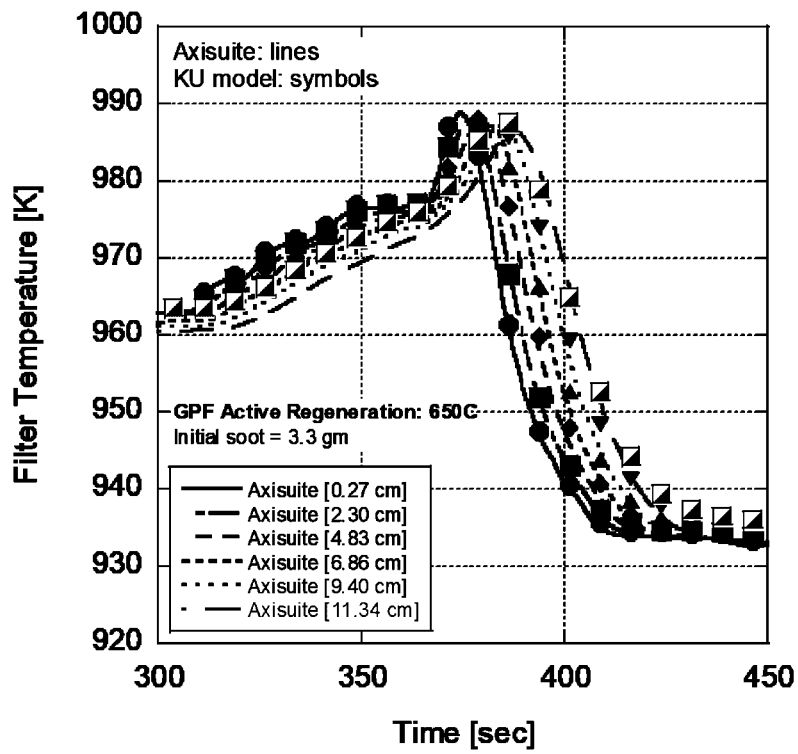
FIG. 10A shows a graph of the comparison to a commercial model for different GPF active and passive regeneration cases.
Figure 10B:
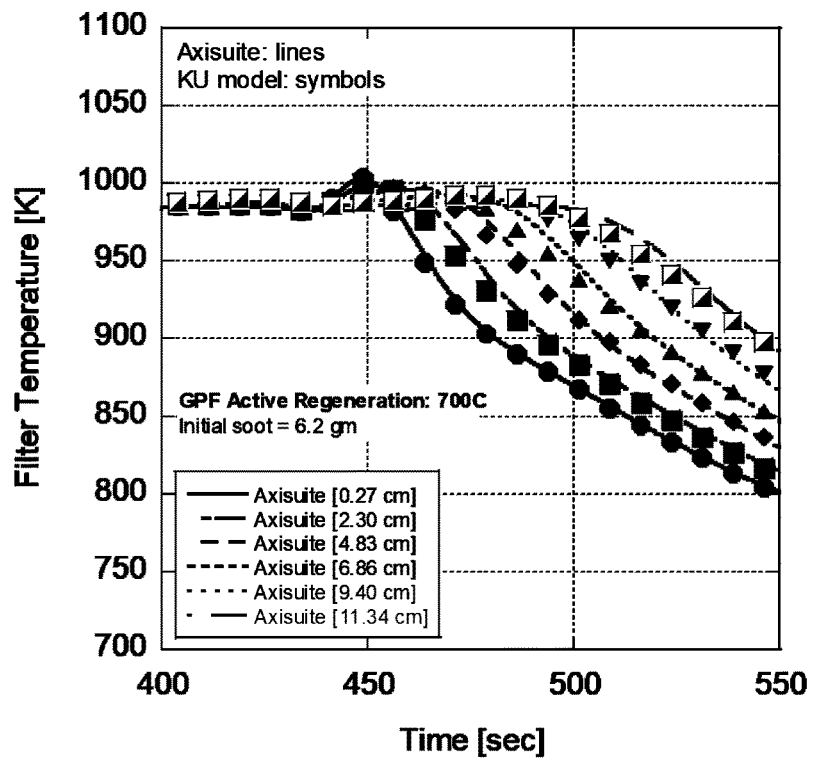
FIG. 10B shows a graph of the comparison to a commercial model for different GPF active and passive regeneration cases.
Figure 10C:
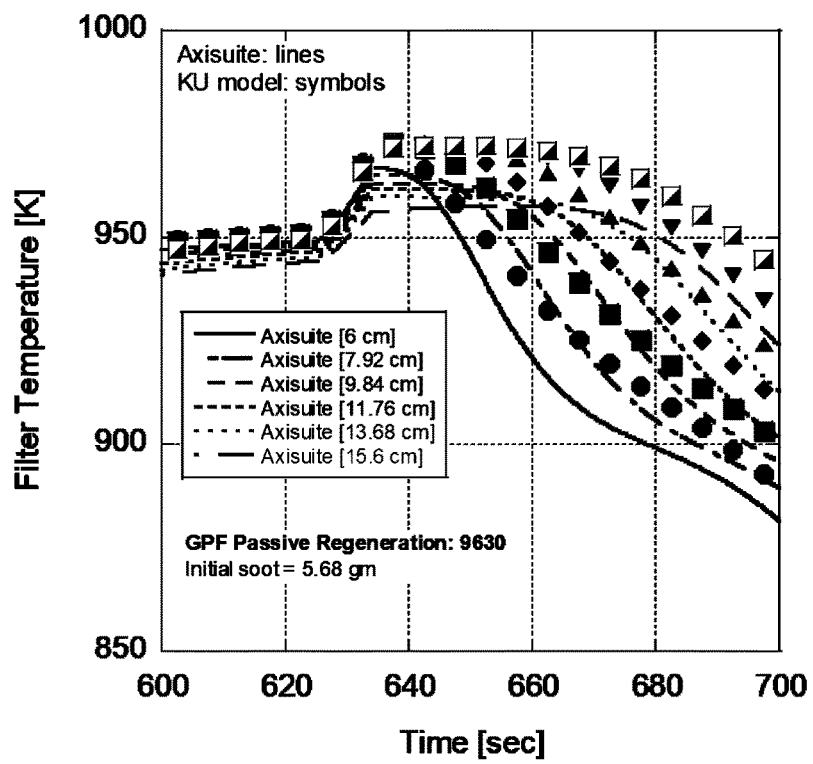
FIG. 10C shows a graph of the comparison to a commercial model for different GPF active and passive regeneration cases.
Figure 10D:
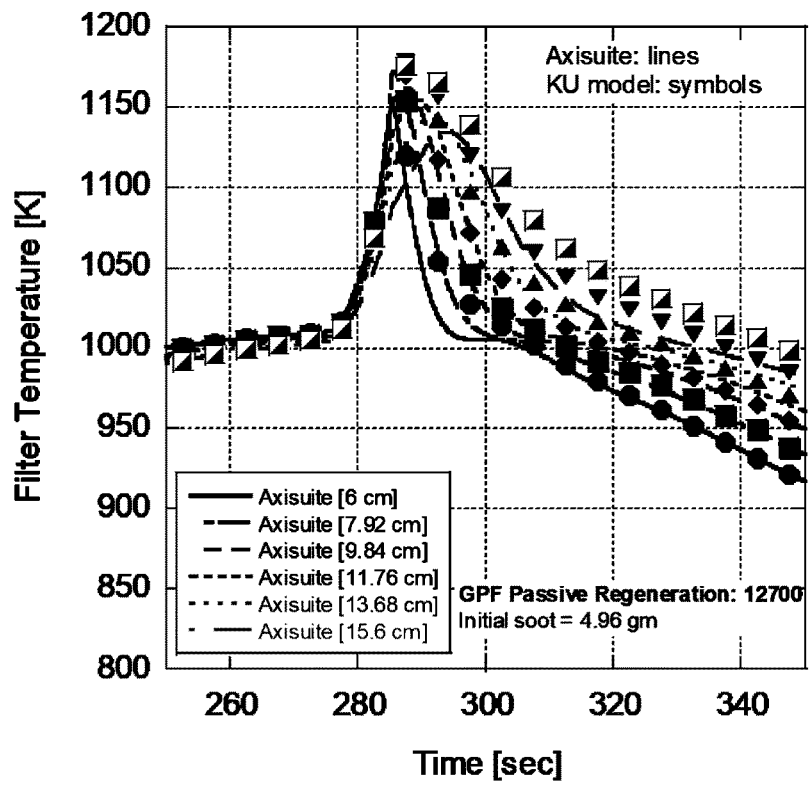
FIG. 10D shows a graph of the comparison to a commercial model for different GPF active and passive regeneration cases.
Figure 10E:
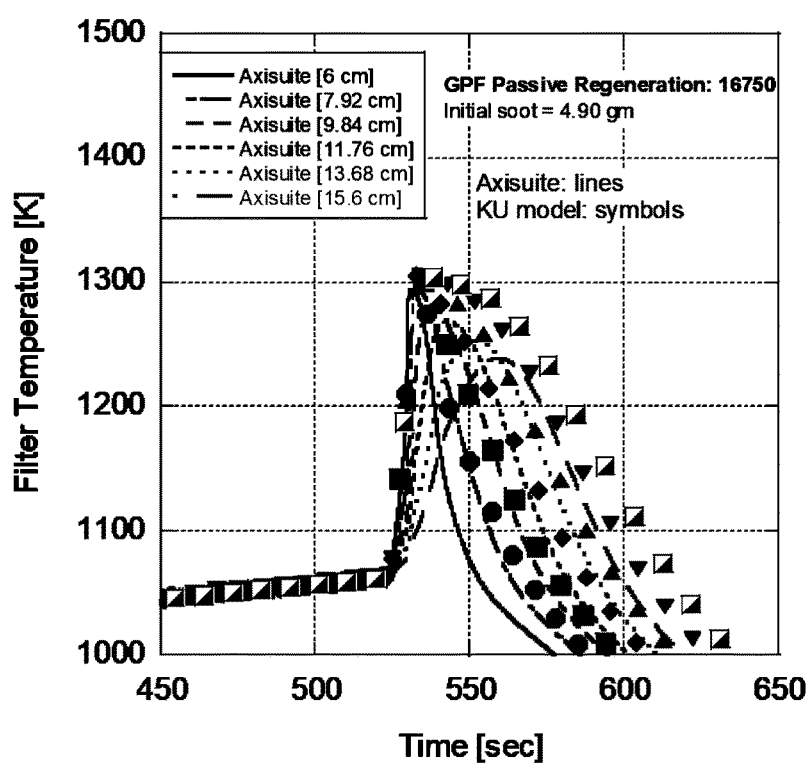
FIG. 10E shows a graph of the comparison to a commercial model for different GPF active and passive regeneration cases.
Figure 10F:
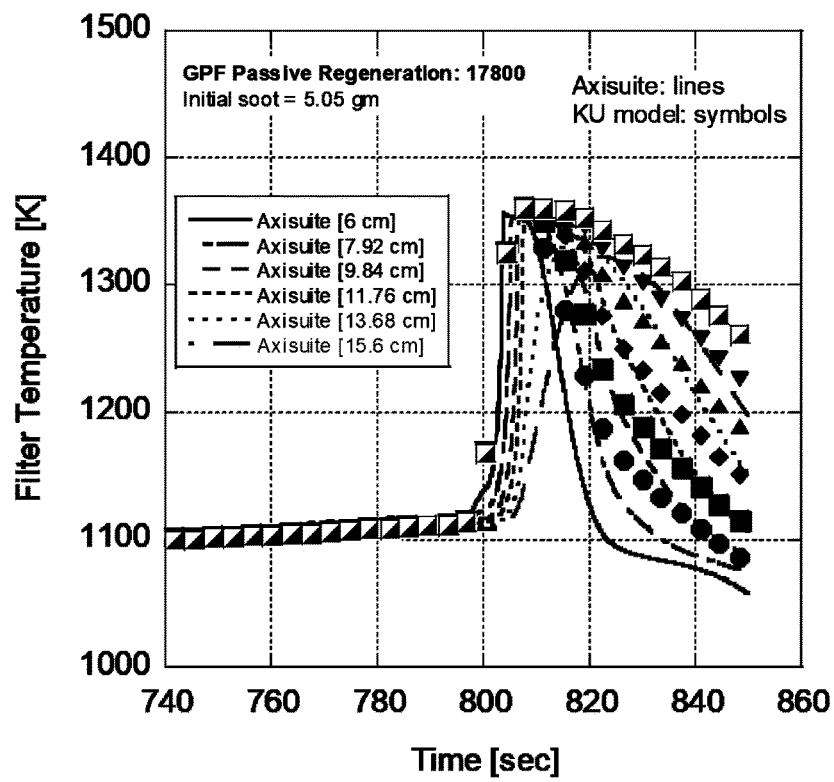
FIG. 10F shows a graph of the comparison to a commercial model for different GPF active and passive regeneration cases.
Figure 10G:
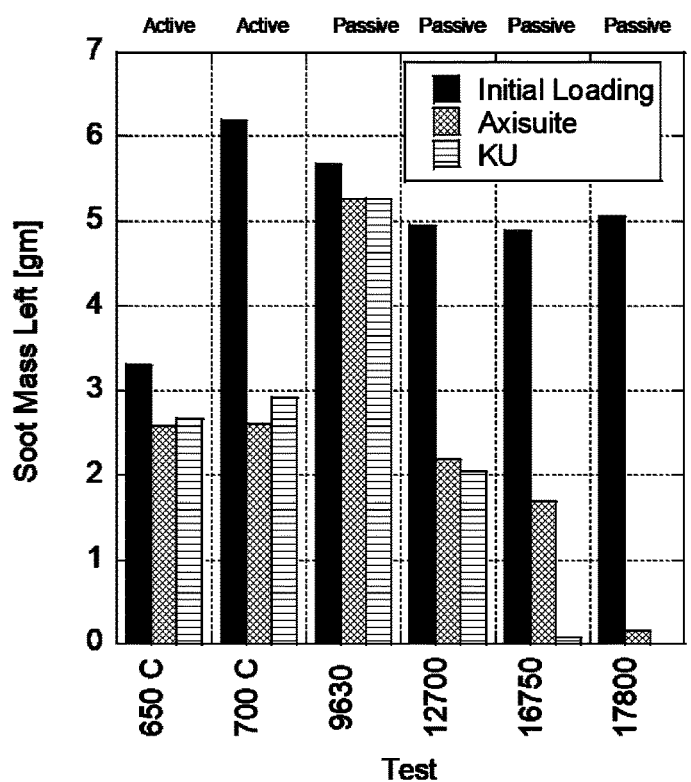
FIG. 10G shows a graph of the comparison of the soot mass left to a commercial model for different GPF active and passive regeneration cases.

FIGS. 8A-8G show graphs of the filter temperature of the Euler Implicit and Euler Explicit temperature derivations as a function of the time. FIG. 8H shows a graph of the soot mass for each test illustrated in FIGS. 8A-8G. For the 17800 case, the model took 5.171+/−0.080 seconds to run; 194× faster than real-time.

FIGS. 9A-9G show graphs of the filter temperature of the Euler Implicit and Euler Explicit temperature derivations as a function of the time. FIG. 8H shows a graph of the soot mass for each test illustrated in FIGS. 9A-9G. In these examples, the model parameters were a combination of the experiments used in the two sections described above.

FIGS. 10A-10G show graphs for different GPF active and passive regeneration cases. For the GPF passive regenerative 16750 case, the model took 1.954+/−0.011 seconds to run, which is 358× faster than real-time.

Table 6, below, compares test results for oxidation events performed under different conditions (e.g., initial temp, initial soot, burn soot) to results determined using the PF modelling techniques disclosed herein.

TABLE 6

| Test | Initial Temp | Initial Soot | Burn Soot | Soot Left (Exp) | Soot Left (Model) |
|---|---|---|---|---|---|
| 1 | 700 | 4.2 | 4.0 | 0.20 | 0.28 |
| 2 | 700 | 6.8 | 6.5 | 0.30 | 0.46 |
| 3 | 600 | 6.8 | 0.2 | 6.60 | 6.60 |
| 4 | 650 | 6.6 | 3.6 | 3.00 | 2.94 |
| 5 | 800 | 2.4 | 2.4 | 0.00 | 0.00 |

As can be seen in Table 6, models according to aspects of the present disclosure demonstrate excellent accuracy in comparison to existing systems. However, when comparing the model results illustrated in FIGS. 10A-10G to against the GPF experimental data, a number of discrepancies are evident. First, the thickness of the thermocouple used to measure exhaust and GPF temperatures may be cause an issue because the time response of the experimental temperature may be different than model predictions. As a result, it may be desired to integrate an algebraic thermocouple model into the simulation tool that corrects the measured temperature as a function of thermocouple thickness.

Furthermore, the soot oxidation kinetics chosen are the default values for the Axisuite model. Since every engine typically generates a different type of soot and dissimilar experiments can also impact the soot generated, it may be preferred to create soot specific kinetic parameters for different engines. To create soot specific kinetic parameters for different engines, the kinetic parameters of Equation 58 may be calibrate to soot oxidation events for each different engine type.

As shown above, aspects of the present disclosure provide a framework for creating a 3D model including different soot oxidation levels in the radial direction. However, only a single representative channel may be used for the chemical species (i.e., providing the average oxygen level for soot oxidation). Therefore, it would be possible to create a multiple channel model with unique oxygen levels throughout the entire filter, which should improve the overall soot burned accuracy and temperature predictions. Unfortunately, this would have the adverse impact of increasing the computational run time. Along similar lines, ash is a significant issue for the longevity of PFs. As a result, including ash correction terms for both temperature and soot oxidation in the model can help improve the accuracy of the model over the lifetime of a PF installed in an exhaust system.

The model may be dynamically configured based on the exhaust system configuration. For example, if nitrogen oxide ($NO_x$) sensors are installed on the exhaust, nitrogen dioxide ($NO_2$) oxidation kinetics may be accounted for in the model. This would improve accuracy during passive regeneration events. Finally, the overall goal of implementing the model into the an EMS can be accomplished. Specifically, the model can be revised in order to be more predictive rather than reactive. For example, instead of taking in an input file and providing results after the experiments are accomplished, the input can be adjusted and then used to predict a future time interval (e.g., 5, 10, etc. seconds into the future) in order to tell the EMS whether or not to begin a soot oxidation event. As a result, the model can provide an "advanced predictive" simulation that helps ensure the safety and longevity of PFs on board the vehicle.

As shown above, embodiments of the present disclosure may be used to solve soot oxidation, cerium reactions, and the filter temperature including exothermic reactions in a completely algebraic manner, thereby improving the speed at which a model may be evaluated and enabling the model to be evaluated via an on-board computer (e.g., an EMS or other computing device) of a vehicle. Moreover, experimental results have demonstrated that models according to aspects of the present disclosure exhibit excellent accuracy in comparison to commercial models that run significantly slower. As a result, the models operating in accordance with the techniques disclosed herein may dramatically reduce PF development time and material costs. Additionally, the model techniques disclosed herein may be used in a predictive manner to test PF characteristics prior to implementation of a device on the exhaust of a vehicle. That is, due to the faster capabilities of the disclosed modelling techniques, multiple simulations may be performed to predict an optimum time to initiate a soot oxidation event. In addition, the invention may be used to identify specific characteristics of importance for a PF (e.g., channel diameter size) and the disclosed modelling techniques may be tailored to a PF specification, such as by working with a PF supplier.

Furthermore, the modelling techniques disclosed herein may be integrated into an EMS, which may preserve the life of the PF while enhancing its effectiveness. The models may be used to test soot oxidation events before starting them. This facilitates predictions of the maximum temperature reached along with the effectiveness of the regeneration event, enabling an optimized time for initiating the regeneration event to be identified. Not only will this protect the PF from damage (i.e., temperatures too high), it can also improve the fuel economy of the vehicle by minimizing the needed fuel energy for a regeneration event. This can enhance the lifetime of the PF while also reducing the needed maintenance on the device, subsequently reducing the operational cost of the vehicle. As a result, vehicles with increased fuel economy and lower emissions may be produced.

Although the embodiments of the present disclosure and their advantages have been described in detail, it should be understood that various changes, substitutions and alterations can be made herein without departing from the spirit and scope of the disclosure as defined by the appended claims. Further, although the drawings may illustrate some of the concepts disclosed herein as logical or functional blocks, it is to be understood that each of those blocks may be implemented in hardware, software, or a combination of hardware and software. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for controlling oxidation of a particulate filter (PF), the method comprising:
   compiling, by a processor, input data for initializing a PF modelling program comprising a model of the PF;
   executing, by the processor, the PF modelling program to simulate the PF based at least in part on the compiled input data and the model of the PF, wherein the simulation of the PF using the PF modelling program comprises:
      calculating soot characteristics representative of soot present in the model of the PF; and
      determining a 3-dimensional (3D) temperate estimate for the model of the PF based on the soot characteristics, information associated with physical characteristics of the PF, and one or more reaction parameters; and
   initiating an oxidation event at the PF based on the simulation of the PF using the PF model of the PF modelling program.

2. The method of claim 1, wherein the 3D temperate estimate is determined using one or more algebraic solutions according to a Euler methodology.

3. The method of claim 2, wherein the Euler methodology is one of a Euler explicit methodology and a Euler implicit methodology.

4. The method of claim 1, further comprising determining the information associated with the physical characteristics of the PF, wherein the information associated with the physical characteristics of the PF comprises a representation of a volume of the PF having one or more cells corresponding to a portion of the volume of the PF.

5. The method of claim 1, further comprising:
   executing a plurality of additional simulations of the PF using the model of the PF modelling program; and
   determining an optimized time for initiating the oxidation event at the PF based on the simulation and the plurality of additional simulations, wherein the oxidation event is initiated at the optimized time.

6. The method of claim 5, wherein the optimized time for initiating the oxidation event is determined, based at least in part, on 3D temperature estimates for the model of the PF determined by the simulation and the plurality of additional simulations.

7. The method of claim 1, wherein the PF modelling program is integrated within a vehicle that includes the processor, and wherein the PF modelling program is executed by the processor of the vehicle.

8. The method of claim 1, wherein the oxidation event is initiated at the PF, based at least in part, on the 3D temperate estimate for the model of the PF determined by the simulation.

9. A non-transitory computer-readable storage medium storing instructions that, when executed by one or more processors, cause the one or more processors to perform operations for controlling oxidation of a particulate filter (PF), the operations comprising:
   compiling input data for initializing a PF modelling program comprising a model of the PF;
   executing the PF modelling program to simulate the PF based at least in part on the compiled input data and the model of the PF, wherein the simulation of the PF using the PF modelling program comprises:
      calculating soot characteristics representative of soot present in the model of the PF; and
      determining a 3-dimensional (3D) temperate estimate for the model of the PF based on the soot characteristics, information associated with physical characteristics of the PF, and one or more reaction parameters; and
   initiating an oxidation event at the PF based on the simulation of the PF using the PF model of the PF modelling program.

10. The non-transitory computer-readable storage medium of claim 9, wherein the 3D temperate estimate is determined using one or more algebraic solutions according to a Euler methodology.

11. The non-transitory computer-readable storage medium of claim 10, wherein the Euler methodology is one of a Euler explicit methodology and a Euler implicit methodology.

12. The non-transitory computer-readable storage medium of claim 9, further comprising determining the information associated with the physical characteristics of the PF, wherein the information associated with the physical characteristics of the PF comprises a representation of a volume of the PF having one or more cells corresponding to a portion of the volume of the PF.

13. The non-transitory computer-readable storage medium of claim 9, further comprising:
  executing a plurality of additional simulations of the PF using the model of the PF modelling program; and
  determining an optimized time for initiating the oxidation event at the PF based on the simulation and the plurality of additional simulations, wherein the oxidation event is initiated at the optimized time.

14. The non-transitory computer-readable storage medium of claim 13, the operations further comprising determining 3D temperature estimates for the model of the PF based on the simulation and the plurality of additional simulations, wherein the optimized time for initiating the oxidation event is determined, based at least in part, on the 3D temperature estimates for the model of the PF.

15. The non-transitory computer-readable storage medium of claim 9, wherein the PF modelling program is integrated within a vehicle, and wherein the PF modelling program is executed by a processor of an emissions management system of the vehicle.

16. The non-transitory computer-readable storage medium of claim 9, wherein the oxidation event is initiated at the PF, based at least in part, on the 3D temperate estimate for the model of the PF determined by the simulation.

17. A system for controlling oxidation of a particulate filter (PF), the system comprising:
  an engine;
  a particular filter (PF) configured to process at least a portion of exhaust generated by the engine;
  one or more sensors;
  a memory; and
  one or more processors communicatively coupled to the memory and the one or more sensors, the one or more processors configured to:
    compile input data for initializing a PF modelling program based on information received from the one or more sensors, the PF modelling program comprising a model of the PF;
    execute the PF modelling program to simulate the PF based at least in part on the compiled input data and the model of the PF, wherein the simulation of the PF using the PF modelling program comprises:
      calculating soot characteristics representative of soot present in the model of the PF; and
      determining a 3-dimensional (3D) temperate estimate for the model of the PF based on the soot characteristics, information associated with physical characteristics of the PF, and one or more reaction parameters; and
    initiate an oxidation event at the PF based on the simulation of the PF using the PF model of the PF modelling program.

18. The system of claim 17, wherein the 3D temperate estimate is determined using one or more algebraic solutions according to a Euler methodology.

19. The system of claim 17, wherein the one or more processors are configured to:
  execute a plurality of additional simulations of the PF using the model of the PF modelling program; and
  determine an optimized time for initiating the oxidation event at the PF based on the simulation and the plurality of additional simulations, wherein the oxidation event is initiated at the optimized time.

20. The system of claim 19, wherein the optimized time for initiating the oxidation event is determined, based at least in part, on 3D temperature estimates for the model of the PF determined by the simulation and the plurality of additional simulations.

* * * * *

UNITED STATES PATENT AND TRADEMARK OFFICE
CERTIFICATE OF CORRECTION

PATENT NO. : 11,566,555 B2
APPLICATION NO. : 17/260102
DATED : January 31, 2023
INVENTOR(S) : Christopher Depcik et al.

It is certified that error appears in the above-identified patent and that said Letters Patent is hereby corrected as shown below:

On the Title Page

Item (57) Abstract, Line 2, delete "closed" and replace with --disclosed--.

In the Specification

At Column 10, Line number 14, equation 25, delete "$Vs_{i,j} = V_{i,j} - V_{i,j} - Ves_{i,j}$" and replace with --$Vs_{i,j} = V_{i,j} - Vf_{i,j} - Ves_{i,j}$--.

At Column 10, Line number 43, equation 28, delete the portion of the equation reading "$(\frac{Nc_i}{2})\Delta L_t \rho_s$," and replace with --$(\frac{Nc_t}{2})L_t \rho_s$--.

At Column 10, Line number 50, equation 29, delete the portion of the equation reading "$Nc_i$" and replace with --$Nc_t$--.

At Column 12, Line number 37, equation 43, delete the portion of the equation reading "$k_m(\rho_t Y_t - \rho_i Y_i) + \rho_i u_s Y_1$" and replace with --$k_m(\rho_I Y_I - \rho_I Y_s) + \rho_I u_s Y_1$--.

At Column 14, Line number 60, equation 64, delete the first occurrence of the portion of the equation reading "$X_{s,O2}$" and replace with --$X_{s,O2}^{(y)}$--.

At Column 16, Line number 52, equation 86, delete the portion of the equation reading "$X_{s,CO2} \mid in^{\exp}$" and replace with --$X_{s,O2} \mid in^{\exp}$--.

At Column 19, Line number 41, equation 114, delete the portion of the equation reading "$-k_m(\rho_u Y_w - \rho_w Y_w)$" and replace with -- $-k_m(\rho_{II} Y_{II} - \rho_w Y_w)$--.

At Column 19, Line number 49, equation 115, delete the portion of the equation reading "$-k_m(\rho_u Y_u - \rho_w Y_w)$" and replace with -- $-k_m(\rho_{II} Y_{II} - \rho_w Y_w)$--.

At Column 26, Line number 24, equation 170, delete the portion of the equation reading "$\frac{E}{F}$" and replace with --$\frac{E}{G}$--.

Signed and Sealed this
Eighteenth Day of April, 2023

Katherine Kelly Vidal
*Director of the United States Patent and Trademark Office*